(12) United States Patent
Kim et al.

(10) Patent No.: US 12,525,539 B2
(45) Date of Patent: Jan. 13, 2026

(54) SEMICONDUCTOR DEVICE

(71) Applicant: Samsung Electronics Co., Ltd., Suwon-si (KR)

(72) Inventors: Jinnam Kim, Anyang-si (KR); Kwangjin Moon, Hwaseong-si (KR); Hojin Lee, Hwaseong-si (KR); Pilkyu Kang, Hwaseong-si (KR); Hoonjoo Na, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 311 days.

(21) Appl. No.: 18/347,512

(22) Filed: Jul. 5, 2023

(65) Prior Publication Data

US 2023/0352410 A1 Nov. 2, 2023

Related U.S. Application Data

(63) Continuation of application No. 16/863,126, filed on Apr. 30, 2020, now Pat. No. 11,721,628.

(30) Foreign Application Priority Data

Jul. 23, 2019 (KR) .......................... 10-2019-0088905

(51) Int. Cl.
*H01L 29/76* (2006.01)
*H01L 21/768* (2006.01)
(Continued)

(52) U.S. Cl.
CPC ...... *H01L 23/535* (2013.01); *H01L 21/76805* (2013.01); *H01L 21/76831* (2013.01);
(Continued)

(58) Field of Classification Search
CPC ............. H01L 23/535; H01L 21/76805; H01L 21/76831; H01L 21/76843;
(Continued)

(56) References Cited

U.S. PATENT DOCUMENTS 6,818,931 B2 11/2004 Liu et al.
7,741,218 B2 6/2010 Sparks et al.
(Continued)

FOREIGN PATENT DOCUMENTS

CN 102034824 A 4/2011
CN 106057892 A 10/2016
(Continued)

OTHER PUBLICATIONS

Notice of Allowance in Chinese Appln. No. 202010670130.1, mailed on Jul. 29, 2025, 13 pages (with Machine Translation).
(Continued)

*Primary Examiner* — Theresa T Doan
(74) *Attorney, Agent, or Firm* — Fish & Richardson P.C.

(57) ABSTRACT

A semiconductor device includes a substrate having a first and second surface opposite to each other, and an active region on the first surface and defined by a first isolation region; a plurality of active fins on the active region, extending in a first direction, and defined by a second isolation region having a second depth smaller than a first depth of the first isolation region; a buried conductive wiring in a trench adjacent to the fins, and extending in a direction of the trench; a filling insulation portion in the trench, and having the wiring therein; an interlayer insulation layer on the first and second isolation regions and on the buried conductive wiring; a contact structure penetrating the interlayer insulation layer, and contacting the buried conductive wiring; and a conductive through structure extending through the substrate from the second surface to the trench, and contacting the buried conductive wiring.

20 Claims, 30 Drawing Sheets

(51) Int. Cl.
  *H01L 23/48*    (2006.01)
  *H01L 23/485*   (2006.01)
  *H01L 23/528*   (2006.01)
  *H01L 23/535*   (2006.01)
  *H01L 29/94*    (2006.01)
  *H10D 30/01*    (2025.01)
  *H10D 30/62*    (2025.01)
  *H10D 62/10*    (2025.01)
  *H10D 62/13*    (2025.01)

(52) U.S. Cl.
  CPC .. *H01L 21/76843* (2013.01); *H01L 21/76895* (2013.01); *H01L 21/76898* (2013.01); *H01L 23/481* (2013.01); *H01L 23/485* (2013.01); *H01L 23/5286* (2013.01); *H10D 30/024* (2025.01); *H10D 30/6211* (2025.01); *H10D 30/6219* (2025.01); *H10D 62/116* (2025.01); *H10D 62/151* (2025.01)

(58) Field of Classification Search
  CPC ......... H01L 21/76895; H01L 21/76898; H01L 23/481; H01L 23/485; H01L 21/743; H01L 21/76832; H10D 30/024; H10D 30/6211; H10D 30/6219; H10D 86/215; H10D 84/0149; H10D 84/0158; H10D 64/513; H10D 30/611
  USPC ....................................................... 257/382
  See application file for complete search history.

(56) References Cited

U.S. PATENT DOCUMENTS

| | | | |
|---|---|---|---|
| 8,853,857 B2 * | 10/2014 | Farooq | H01L 21/76898 257/773 |
| 9,620,504 B2 | 4/2017 | Moon et al. | |
| 9,646,930 B2 | 5/2017 | Tezcan et al. | |
| 9,780,210 B1 | 10/2017 | Goktepeli et al. | |
| 10,170,413 B2 | 1/2019 | Ohtou et al. | |
| 10,170,476 B2 | 1/2019 | Chapman et al. | |
| 10,199,273 B2 | 2/2019 | Kuo et al. | |
| 10,504,776 B2 | 12/2019 | Chen et al. | |
| 11,380,607 B2 | 7/2022 | Kim et al. | |
| 2008/0284029 A1 | 11/2008 | Kim et al. | |
| 2010/0230735 A1 | 9/2010 | Zhu | |
| 2010/0258858 A1 | 10/2010 | Kim | |
| 2011/0068384 A1 | 3/2011 | Kim et al. | |
| 2011/0101450 A1 | 5/2011 | Kim | |
| 2013/0249045 A1 | 9/2013 | Kang et al. | |
| 2014/0210058 A1 | 7/2014 | Lee et al. | |
| 2014/0239498 A1 | 8/2014 | Coolbaugh et al. | |
| 2015/0279998 A1 | 10/2015 | Song | |
| 2016/0043206 A1 | 2/2016 | Ikegami et al. | |
| 2016/0293598 A1 | 10/2016 | Kim et al. | |
| 2017/0062421 A1 | 3/2017 | Cosemans et al. | |
| 2018/0145030 A1 * | 5/2018 | Beyne | H01L 21/76898 |
| 2018/0151494 A1 | 5/2018 | Ohtou et al. | |
| 2018/0294267 A1 | 10/2018 | Licausi et al. | |
| 2018/0358293 A1 | 12/2018 | Hong et al. | |
| 2019/0067290 A1 | 2/2019 | Wang et al. | |
| 2019/0221649 A1 | 7/2019 | Glass et al. | |
| 2019/0259699 A1 | 8/2019 | Morrow et al. | |
| 2019/0378790 A1 | 12/2019 | Bohr et al. | |
| 2020/0105671 A1 | 4/2020 | Lai et al. | |
| 2021/0028112 A1 | 1/2021 | Kim et al. | |

FOREIGN PATENT DOCUMENTS

| | | |
|---|---|---|
| CN | 107342327 A | 11/2017 |
| CN | 109037189 A | 12/2018 |
| CN | 109427775 A | 3/2019 |
| EP | 3324436 | 5/2018 |
| JP | 2009295719 | 12/2009 |
| JP | 2010129952 | 6/2010 |
| JP | 2014-207252 A | 10/2014 |
| JP | 6385755 B2 | 9/2018 |
| KR | 10-2003-0032858 A | 4/2003 |
| KR | 10-0843715 B1 | 7/2008 |
| KR | 10-2013-0107591 | 10/2013 |
| KR | 10-2019-0024538 | 3/2019 |
| KR | 10-2019-0036533 | 4/2019 |

OTHER PUBLICATIONS

Office Action in Korean Appln. No. 10-2019-0088905, mailed on Jul. 25, 2024, 16 pages (with English translation).
Office Action in Chinese Appln. No. 202010670130.1, mailed on Feb. 24, 2025, 20 pages (with English translation).
Notice of Allowance in Korean Appln. No. 10-2019-0088905, mailed on Nov. 10, 2025 6 pages (with machine translation).

* cited by examiner

SEMICONDUCTOR DEVICE

CROSS-REFERENCE TO RELATED APPLICATION

This application is a continuation of U.S. application Ser. No. 16/863,126, filed Apr. 30, 2020, which claims benefit of priority to Korean Patent Application No. 10-2019-0088905 filed on Jul. 23, 2019, in the Korean Intellectual Property Office, the disclosure of which are incorporated herein by reference in their entireties.

FIELD

The present disclosure relates to a semiconductor devices and methods of fabricating the same.

BACKGROUND

In various semiconductor devices such as logic circuits and memories, active regions, such as source and drain regions, may be connected to metal wiring of a back end of line (BEOL) through contact structures.

However, with higher integration of semiconductor devices, when the size of an active element such as a transistor is reduced, or a line width and/or pitch of metal wiring is reduced, there may be problems in which undesired short-circuits may occur in interconnecting the metal wiring and the active regions.

SUMMARY

Example embodiments provide a semiconductor device capable of reducing the occurrence of short-circuits (or 'shorts') between a conductive through structure and other components adjacent thereto.

According to an example embodiment, a semiconductor device includes a substrate having a first surface and a second surface opposite to each other, and having an active region located on the first surface and defined by a first isolation region; a plurality of active fins arranged on the active region, extending in a first direction, and defined by a second isolation region having a second depth smaller than a first depth of the first isolation region; a buried conductive wiring formed in a trench adjacent to the plurality of active fins, and extending in a direction of the trench; a filling insulation portion in the trench, and having the buried conductive wiring therein; an interlayer insulation layer on the first and second isolation regions to cover the buried conductive wiring; a contact structure penetrating the interlayer insulation layer, and contacting the buried conductive wiring; and a conductive through structure extending through the substrate from the second surface to the trench, and contacting the buried conductive wiring.

According to an example embodiment, a semiconductor device includes a substrate having an upper surface and a rear surface; a trench in the substrate having a first width and extending in one direction; a buried conductive wiring in the trench, extending in the one direction, and having a second width, narrower than the first width; a filling insulation portion in the trench, and having the buried conductive wiring therein; a device isolation layer in the substrate and defining an active region; an interlayer insulation layer on the device isolation layer, the active region, and the buried conductive wiring; a contact structure penetrating the interlayer insulation layer and contacting the buried conductive wiring; a conductive through structure extending through the substrate from the rear surface to the trench and including an end portion adjacent the trench and contacting the buried conductive wiring; and a backside wiring portion on the rear surface of the substrate and electrically connected to the conductive through structure.

According to an example embodiment, a semiconductor device includes a substrate having an upper surface including an active region; a plurality of active fins on the active region and extending in one direction; a buried conductive wiring in a trench adjacent to the plurality of active fins, and extending in the one direction; a dielectric barrier between an inner side wall of the trench and a side surface of the buried conductive wiring; an interlayer insulation layer on the upper surface of the substrate, and on the buried conductive wiring; a contact structure penetrating the interlayer insulation layer, and contacting the buried conductive wiring; a through-hole penetrating the substrate from a rear surface of the substrate, and having a bottom surface that exposes a region of the buried conductive wiring and a portion of the substrate; a conductive through structure having a dielectric liner on the substrate along an inner side wall and the bottom surface of the through-hole, and a conductive material in an inside portion of the through-hole and contacting the region of the buried conductive wiring exposed by the bottom surface; and a backside wiring portion on the rear surface of the substrate and electrically connected to the conductive through structure.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments of the present inventive concept will be described in detail with reference to the accompanying drawings.

Figure 1:
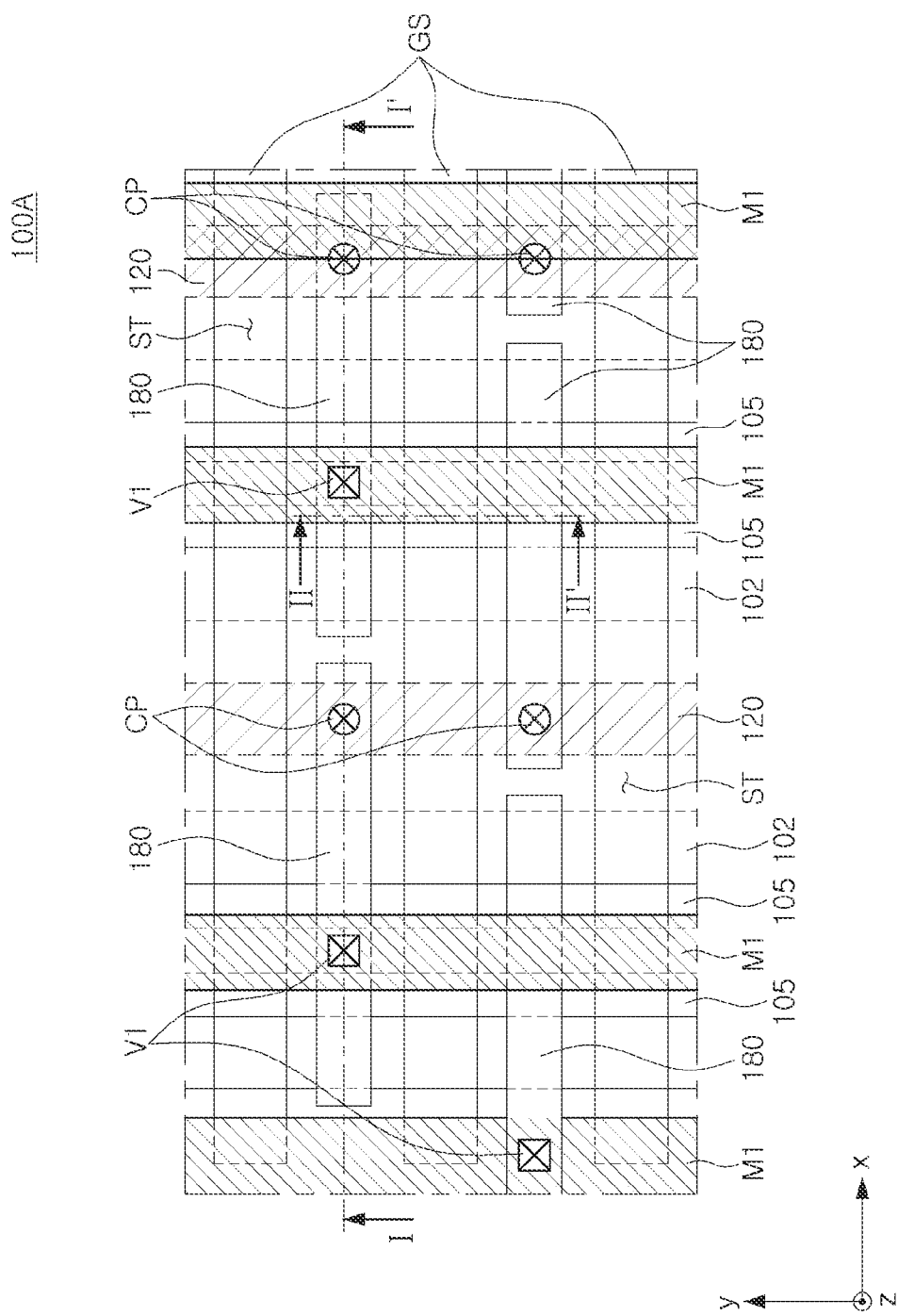
FIG. 1 illustrates a layout or top plan view of an upper surface of a semiconductor device according to an example embodiment.
Figure 2:
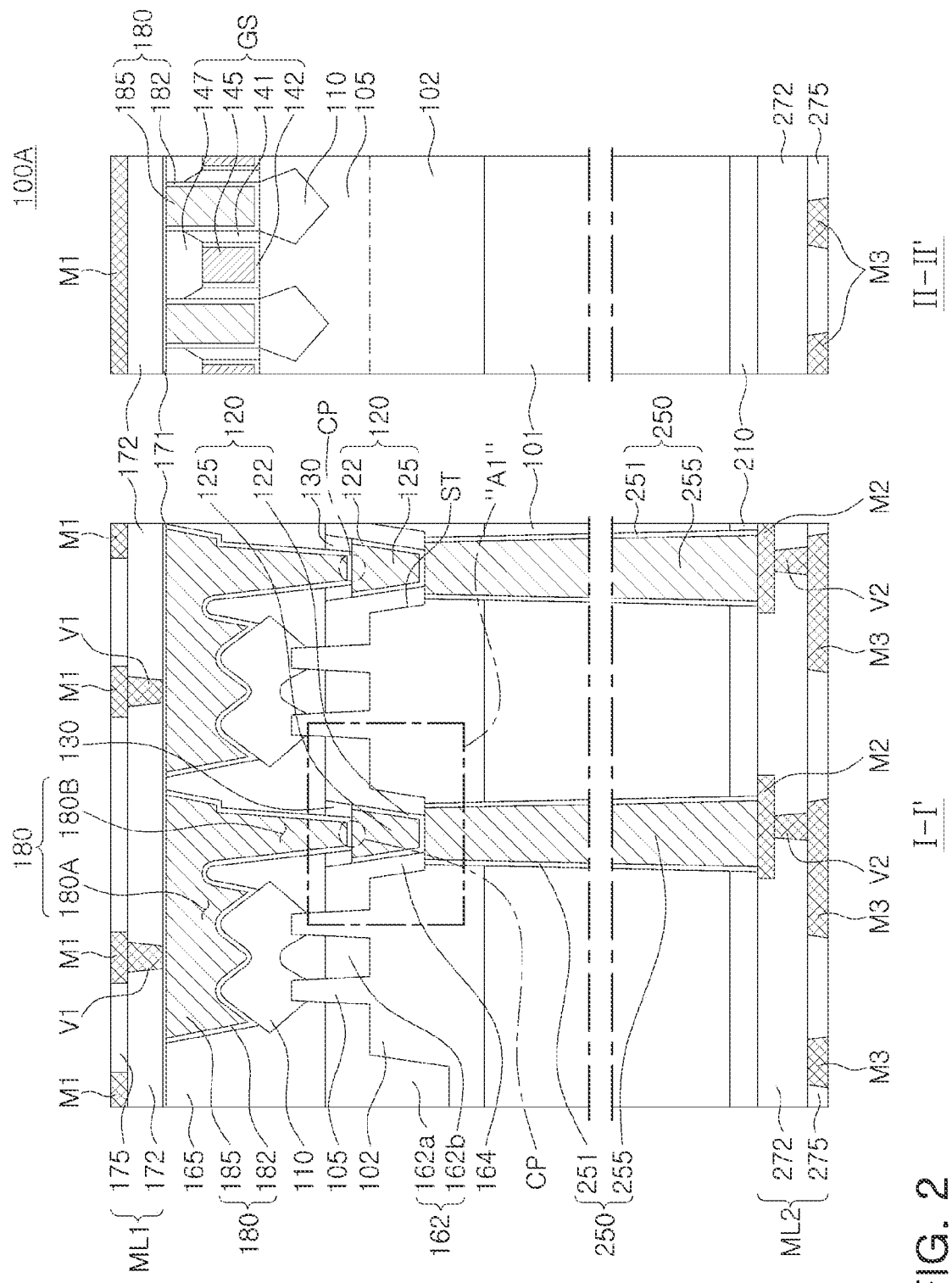
FIG. 2 is a cross-sectional view of the semiconductor device illustrated in FIG. 1, taken along lines I-I' and II-II'.

FIG. 1 illustrates a layout or plan view of an upper surface of a semiconductor device according to an example embodiment, and FIG. 2 is a cross-sectional view of the semiconductor device illustrated in FIG. 1, taken along lines I-I' and Spatially relative terms, such as "beneath," "below," "lower," "rear," "above," "upper," and the like, may be used herein for ease of description to describe one element's or feature's relationship to another element(s) or feature(s) as illustrated in the figures, but will be understood as intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below.

Referring to FIGS. 1 and 2, a semiconductor device 100A according to this embodiment may include a substrate 101 having an active region 102. A plurality of active fins 105 may be arranged on an upper surface of the active region 102.

In some embodiments, the substrate 101 may include a semiconductor such as Si or Ge, or a compound semiconductor such as SiGe, SiC, GaAs, InAs, or InP. In another example, the substrate 101 may have a silicon-on-insulator (SOI) structure. The active region 102 may be a conductive region such as a well doped with an impurity or a structure doped with an impurity. For example, the active region 102 may be an n-type well for a PMOS transistor or a p-type well for an NMOS transistor, but embodiments described herein are not so limited.

Each of the plurality of active fins 105 may have a structure protruding from the upper surface of the active region 102 in an upper direction (e.g., a z direction). As illustrated in FIG. 1, the plurality of active fins 105 may be arranged side by side on the upper surface of the active region 102, to extend in a first direction (e.g., a y direction). The terms first, second, etc. are used herein merely to distinguish one element from another and not for purposes of limitation. The active fin 105 may be provided as an active region of each transistor. In this embodiment, the active fins 105 are illustrated as being provided in an amount of two (2) per source/drain region 110, but embodiments of the disclosure are not limited thereto. In other embodiments, the active fins 105 may be provided as one (1) per source/drain region 110, three (3) per source/drain region, or more.

The source/drain regions 110 may be formed in a portion of the active fin 105 located on both sides of a gate structure GS. In this embodiment, the source/drain region 110 may form a recess in a portion of the active fin 105, and may perform a selective epitaxial growth (SEG) process on the recess, to have an upper surface higher than an upper surface of the active fin 105. This source/drain region 110 may be also referred to as a raised source/drain (RSD). For example, the source/drain region 110 may be Si, SiGe, or Ge, and may have either an N-type or P-type conductivity. When the source/drain region 110 is formed of the p-type source/drain region, the p-type source/drain region 110 may be re-grown with SiGe, and, as the p-type impurity, for example, boron (B), indium (In), gallium (Ga), boron trifluoride ($BF_3$), or the like may be doped. When silicon (Si) is formed in the source/drain region 110 having the n-type conductivity, as the n-type impurity, for example, phosphorus (P), nitrogen (N), arsenic (As), antimony (Sb), or the like may be doped. Different shapes may be present, in view of a crystallographically stable aspect in the growth process. For example, as illustrated along line II-II' in FIG. 2, the source/drain region 110 may have a pentagonal cross-section (in the case of p-type conductivity), but otherwise have a polygonal cross-section having a hexagonal shape or gentle angle (in the case of n-type).

The semiconductor device 100A according to this embodiment may include a device isolation layer 162.

The device isolation layer 162 may include a first isolation region 162a defining the active region 102, and a second isolation region 162b defining the plurality of active fins 105 adjacent to the first isolation region 162a. The first isolation region 162a may have a bottom surface deeper than the second isolation region 162b. The first isolation region 162a may be referred to as a deep trench isolation (DTI), and the second isolation region 162b may be referred to as a shallow trench isolation (STI). The second isolation region 162b may be disposed on the upper surface of the active region 102. The active fin 105 may penetrate (e.g., extend partially or completely through) the second isolation region 162b, and a portion of the active fin 105 may protrude from the second isolation region 162b.

For example, the device isolation layer 162 may include a silicon oxide or a silicon oxide based insulating material. Specifically, the device isolation layer 162 may be tetraethylorthosilicate (TEOS), undoped silicate glass (USG), phosphosilicate glass (PSG), borosilicate glass (BSG), borophosphosilicate glass (BPSG), fluoride silicate glass (FSG), spin on glass (SOG), Tonen Silazene (TOSZ), or a combination thereof. The device isolation layer 162 may be formed using a chemical vapor deposition (CVD) or spin coating process.

Figure 3:
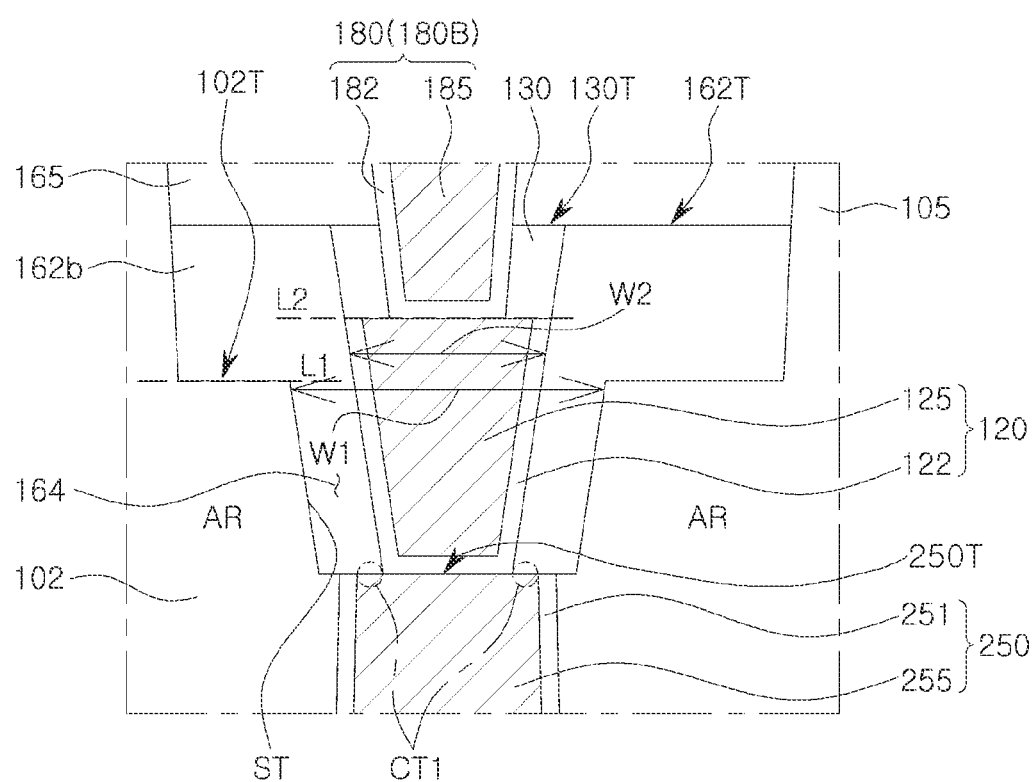
FIG. 3 is an enlarged cross-sectional view illustrating portion "A1" of the semiconductor device illustrated in FIG. 2.

FIG. 3 is an enlarged cross-sectional view illustrating portion "A1" of the semiconductor device illustrated in FIG. 2.

Referring to FIG. 3 together with FIG. 2, a trench ST for disposing a buried conductive wiring 120 may be formed in the active region 102 adjacent to the plurality of active fins 105. In this embodiment, the trench ST may be disposed between the plurality of active fins 105, and may extend in the first direction (e.g., the y direction), similar to the active fin 105 (See FIG. 1). The trench ST employed in this embodiment may have a depth shallower than a depth of the first isolation region 162a, but deeper than a depth of the second isolation region 162b.

The buried conductive wiring 120 may be disposed on the trench ST. The buried conductive wiring 120 may extend along a bottom surface of the trench ST in a second direction (e.g., a y direction) (see FIG. 1).

Referring to FIG. 3, the trench ST may have a width W1 wider than a width W2 of the buried conductive wiring 120. A filling insulation portion 164 may be disposed around the buried conductive wiring 120 to fill the trench ST. The filling insulation portion 164 may be provided with or along an inner side wall and a space (e.g., a floor) of the trench ST. In this embodiment, the filling insulation portion 164 may be a portion of the device isolation layer 162, and may be a portion extending from the device isolation layer 162 and filled in the trench ST. Therefore, the filling insulation portion 164 may include the same material as a material of the device isolation layer 162.

A conductive through structure 250 may extend from a rear surface of the substrate 101 to the trench ST, and may be connected (e.g., physically and/or electrically) to the buried conductive wiring 120. For example, the conductive through structure 250 may be a through silicon via (TSV). Elements referred to herein as on, contacting, or connected to other elements may be directly on, contacting, or connected to the other elements, or intervening elements may be present. In contrast, when an element is referred to as being "directly on," "directly contacting," or "directly connected to" another element, no intervening elements are present.

Referring to FIG. 3, as indicated by "CT1," a portion of the conductive through structure 250 may contact the filling insulation portion 164. In this embodiment, since the filling insulation portion 164 is present around the buried conductive wiring 120, a size of the conductive through structure 250 may be larger than the width W2 of the buried conductive wiring 120 or the conductive through structure 250 may not contact adjacent active regions (e.g., Si), even when the conductive piercing structures 250 is not aligned correctly.

As such, it is possible to effectively prevent or reduce the incidence of undesired shorts that may occur when the conductive through structure 250 is landed on the buried conductive wiring 120.

An upper end or end portion 250T of the conductive through structure 250 may be located lower than a level L1 of an upper surface 102T of the active region 102. In this manner, mutual electrical interference may be suppressed by ensuring a sufficient distance from the active fin 105 without forming the conductive through structure 250 to the upper surface 102T of the active region 102. For example, the conductive through structure 250 may have a size (e.g., a diameter or a width) of 20 nm to 500 nm, and a distance (e.g., a depth) of 200 nm to 3000 nm.

The buried conductive wiring 120 may be connected to a contact structure 180 penetrating an interlayer insulation layer 165. The interlayer insulation layer 165 may be disposed on the device isolation layer 162 to cover the source/drain region 110 and the buried conductive wiring 120. As used herein, "cover" does not require complete coverage. A portion directly covering the buried conductive wiring 120 in the device isolation layer 162, particularly the second isolation region 162b, may be an insulation capping layer 130. The insulation capping layer 130 may have an upper surface 130T that may be substantially coplanar with an upper surface 162T of the device isolation layer 162.

The interlayer insulation layer 165 and/or the insulation capping layer 130 may be formed of the same or similar material as the above-described material of the device isolation layer. The insulation capping layer 130, the device isolation layer 162, and/or the interlayer insulation layer 165 may be distinct visually distinguished, even when they are formed of the same material (e.g., oxide). In particular, since the device isolation layer 162, the interlayer insulation layer 165, and the insulation capping layer 130 have different film qualities when they are formed by different processes, the respective layers may be distinguished or distinct from each other, for example, with respective boundaries therebetween.

The buried conductive wiring 120 employed in this embodiment may have an upper surface lower than an upper end of the active fin 105. The buried conductive wiring 120 may not be exposed externally in a process of forming the source/drain 110. In addition, the buried conductive wiring 120 may be higher than the upper surface 102T of the active region 102. The buried conductive wiring 120 may be electrically connected to the contact structure 180.

The buried conductive wiring 120 is not limited thereto, but may be formed to have an aspect ratio of 2 or more. For example, the buried conductive wiring 120 may have a width of 5 nm to 50 nm.

The contact structure 180 employed in this embodiment may connect the source/drain region 110 and the buried conductive wiring 120 together. In particular, the contact structure 180 may include a first contact area 180A connected to the source/drain region 110, and a second contact area 180B connected to the contact area 180A and connected to the buried conductive wiring 120. The second contact area 180B may be formed deeper than the first contact area 180A, and may be electrically connected to the buried conductive wiring 120. An example of a planar arrangement of contacts CP of the second contact area 180B and the buried conductive wiring 120 may be found in FIG. 1.

The contact structure 180 may be connected to a first wiring portion ML1 constituting a back end of line (BEOL). The first wiring portion ML1 may be configured to connect a plurality of elements (for example, transistors) implemented on an upper surface of the substrate 101 to each other.

The first wiring portion ML1 may include a plurality of low dielectric layers 172 and 175, a plurality of metal wirings M1, and a plurality of metal vias V1. The plurality of low dielectric layers may include first and second low dielectric layers 172 and 175 arranged on the interlayer insulation layer 165. The metal wirings M1 may be formed in the second low dielectric layer 175, and the metal vias V1 may be formed in the first low dielectric layer 172. In this case, each of the metal vias V1 may be formed at a contact to be connected to the contact structure 180 in the metal wiring M1 (see FIGS. 1 and 2). For example, the first and second low dielectric layers 172 and 175 may include a silicon oxide film, a silicon oxynitride film, a SiOC film, a SiCOH film, or a combination thereof. For example, the metal wirings M1 and the metal vias V1 may include a copper or copper-containing alloy. The metal wirings M1 and the metal vias V1 may be formed together using a dual-damascene process.

In this embodiment, an etch stop layer 171 disposed between the interlayer insulation layer 165 and the first low dielectric layer 172 may be further included. The etch stop layer 171 may prevent a metal (e.g., Cu) constituting the metal wirings M1 and the metal vias V1 from diffusing into a lower region, as well as may suppress an etching operation. For example, the etch stop layer 171 may include, but is not limited to, aluminum nitride (AlN).

In this embodiment, the contact structure 180 connected to a plurality of elements (for example, the source/drain region 110, and the like) formed on the substrate 101 may be connected to a second wiring portion ML2 located on the rear surface of the substrate 101, via the buried conductive wiring 120 and the conductive through structure 250.

The second wiring portion ML2 employed in this embodiment may be power lines and signal lines implemented on the rear surface of the substrate 101, and will be understood as a wiring portion replacing a portion of the required BEOL. In this case, since the second wiring portion ML2 may be located on the rear surface of the substrate 101, the second wiring portion ML2 may be also referred to as a "backside wiring portion."

The second wiring portion ML2 may provide a signal line and a power line for a plurality of elements (for example, transistors) implemented on the upper surface of the substrate 101, through the buried conductive wiring 120 and the conductive through structure 250.

After a backside insulation layer 210 is formed on the rear surface of the substrate 101, the conductive through structure 250 may be formed. The second wiring portion ML2 may be provided on the backside insulation layer 210. The second wiring portion ML2 may include a plurality of low dielectric layers 272 and 275, a plurality of first and second metal wirings M2 and M3, and a plurality of metal vias V2. The plurality of low dielectric layers may include first and second low dielectric layers 272 and 275 sequentially disposed on the backside insulation layer 210. The first and second metal wirings M2 and M3 may be formed on the backside insulation layer 210 and in the second low dielectric layer 275, respectively. The metal via V2 connecting the first and second metal wirings M2 and M3 may be formed in the first low dielectric layer 272. The second metal wiring M3 and the metal via V2 may be formed using a dual damascene process. In this case, the first metal wiring M2 may be formed to be connected to the conductive through structure 250.

Figure 4A:
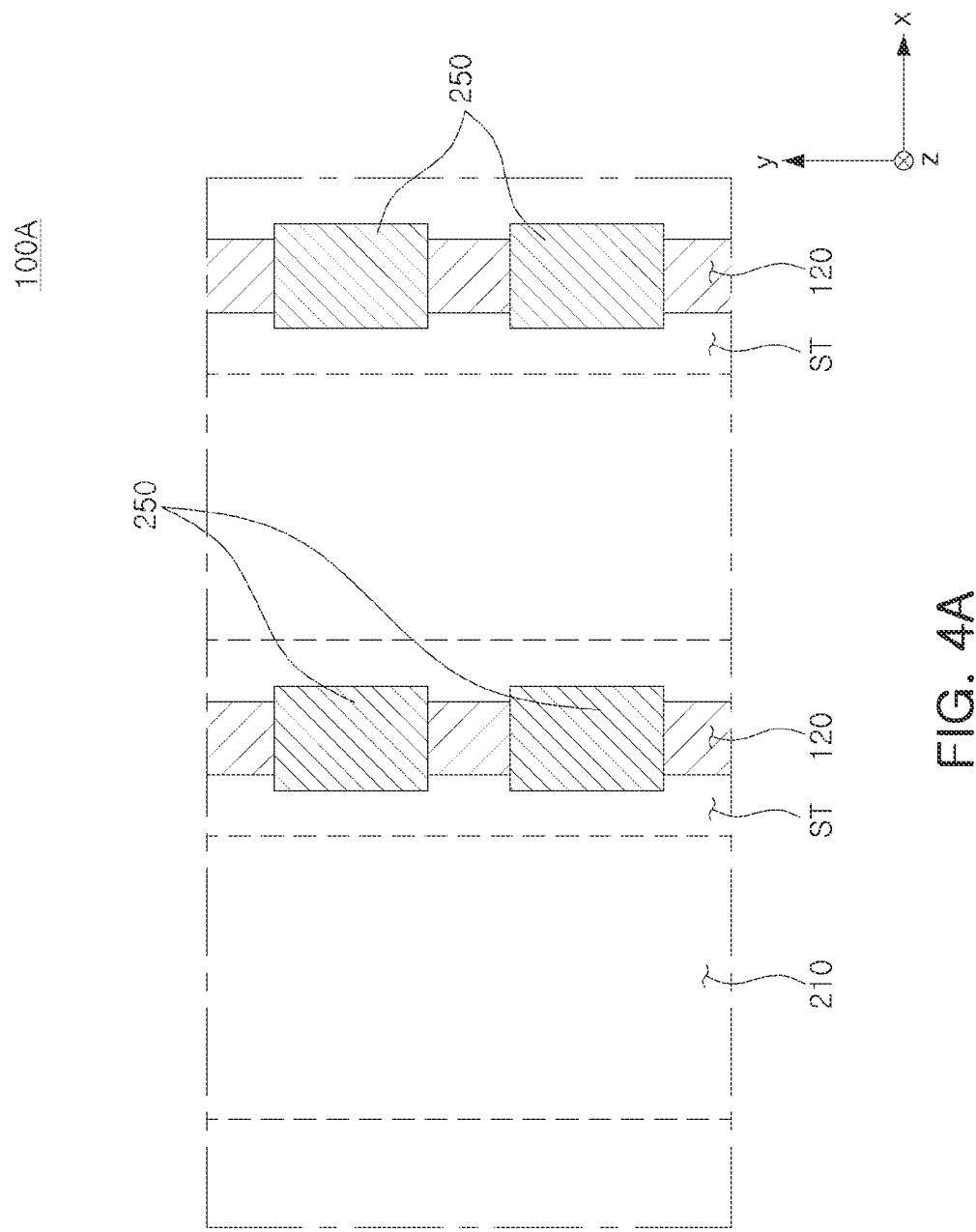
FIGS. 4A and 4B illustrate layouts or bottom plan views of a rear surface of a semiconductor device according to an example embodiment.
Figure 4B:
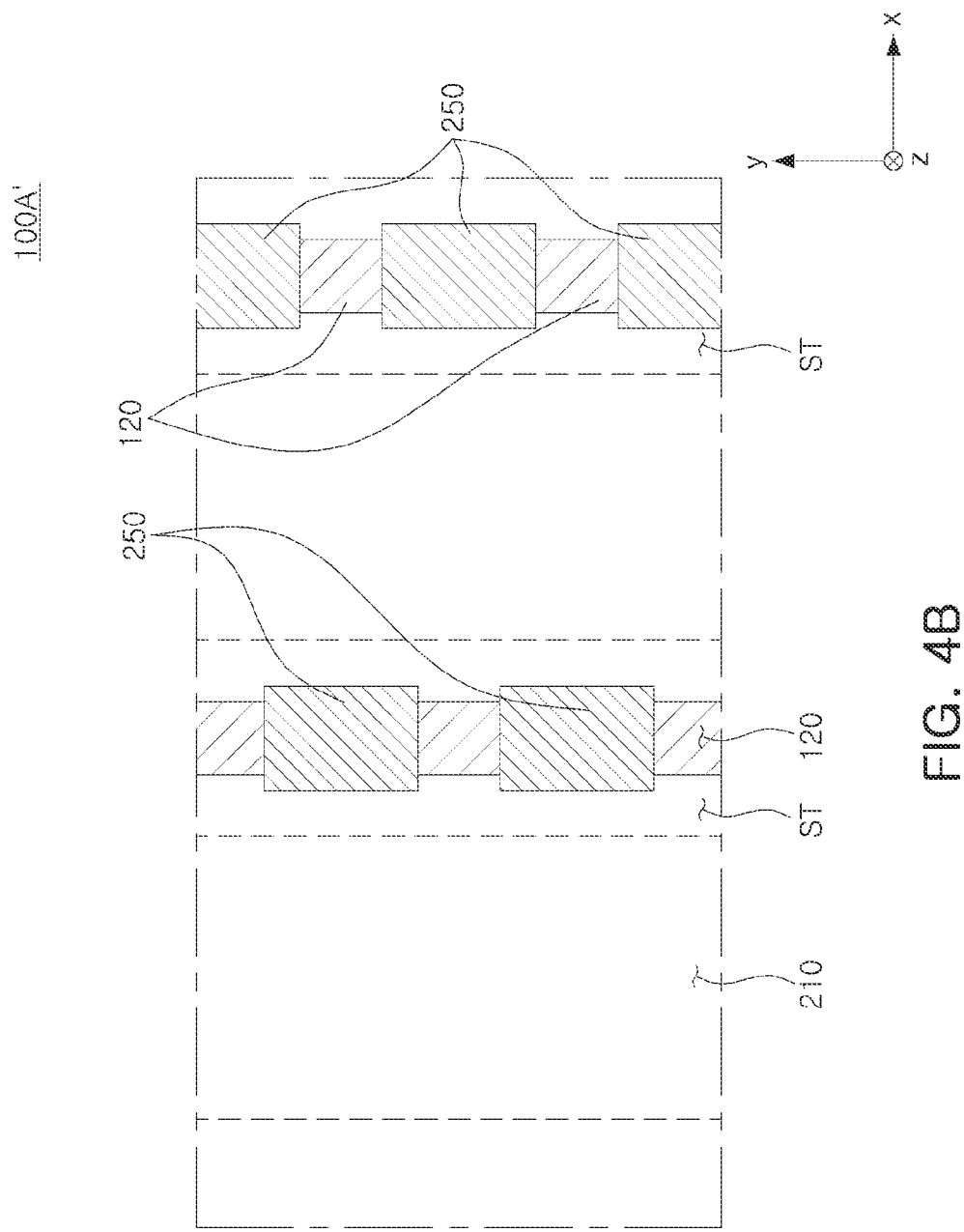

FIG. 4A illustrates a layout of the conductive through structure 250 and the buried conductive wiring 120, when viewed from the rear surface of the substrate 101. The plurality of conductive through structures 250 may be arranged to be connected to the buried conductive wirings 120 extending in the first direction. As illustrated in FIG. 4A, a cross-section of the conductive through structure 250 may have a substantially rectangular shape, and may have a shape by which a distance or dimension in the first direction is greater than a distance or dimension in the second direction, perpendicular thereto. The conductive through structures 250 may be arranged on the same line or aligned in the second direction. The conductive through structures 250 that may be employed in this embodiment may have a variety of different shapes (e.g., a circular shape, an elliptical shape) and/or other arrangements. In some embodiments, as illustrated in FIG. 4B, the conductive through structure 250 may be arranged in a diagonal direction (e.g., non-aligned) with or relative to other conductive through structure 250 adjacent thereto in the second direction.

As such, wirings such as signal lines and power lines necessary for the semiconductor device 100A may be also implemented on the rear surface of the substrate 101 by using the buried conductive wiring 120 and the conductive through structure 250.

The second wiring portion ML2 employed in this embodiment may be illustrated as being implemented, together with the first wiring portion ML1 disposed on the upper surface of the substrate 101, for example, in an upper portion of an element region. In some embodiments, all of the required BEOL may be implemented as the second wiring portion ML2 disposed on the rear surface of the substrate 101 by using the buried conductive wiring 120 and the conductive through structure 250, and the first wiring portion ML1 may be minimized or omitted.

In this embodiment, the conductive through structure 250 may include a conductive material 255, and a dielectric liner 251 disposed between the conductive material 255 and the substrate 101. The buried conductive wiring 120 may include a conductive material 125, and a conductive barrier 122 disposed on the conductive material 125 and a side surface and a lower surface of the conductive material 125. Similarly, the contact structure 180 may include a conductive material 185, and a conductive barrier 182 disposed on a side surface and a lower surface of the conductive material 185.

For example, at least one of the conductive material 125, 185, and 255 in the buried conductive wiring 120, the contact structure 180, and the conductive through structure 250 may include Cu, Co, Mo, Ru, W, or alloys thereof. For example, the dielectric liner 251 of the conductive through structure 250 may include $SiO_2$, SiN, SiCN, SiC, SiCOH, SiON, $Al_2O_3$, AlN, or porous materials thereof. For example, at least one of the conductive barriers 122 and 182 in the buried conductive wiring 120 and the contact structure 180 may include Ta, TaN, Mn, MnN, WN, Ti, TiN, or combinations thereof.

The contact structure 180 may include a metal silicide layer (not illustrated) disposed between the conductive barrier 182 and the source/drain regions 110. For example, the metal silicide layer may be formed of a material such as CoSi, NiSi, TiSi, or the like.

The semiconductor device 100A according to this embodiment may include a gate structure GS. As illustrated in FIG. 1, the gate structure GS may have a linear shape extending in the second direction (e.g., the x direction), crossing the first direction (e.g., the y direction). As such, the gate structure GS may overlap one region of the active fin 105. The gate structure GS used in this embodiment may include gate spacers 141, a gate dielectric film 142 and a gate electrode 145 sequentially arranged between the gate spacers 141, and a gate capping layer 147 disposed on the gate electrode 145.

For example, the gate spacers 141 may include an insulating material such as SiOCN, SiON, SiCN, SiN, or the like. For example, the gate dielectric film 142 may be formed of a silicon oxide film, a high dielectric film, or a combination thereof. The high dielectric film may include a material having a relatively high dielectric constant (e.g., about 10 to 25), higher than those of a silicon oxide film. For example, the high dielectric film may be formed of hafnium oxide, hafnium oxynitride, hafnium silicon oxide, lanthanum oxide, lanthanum aluminum oxide, or combinations thereof, but is not limited thereto. The gate dielectric film 142 may be formed by an atomic layer deposition (ALD) process, a chemical vapor deposition (CVD) process, or a physical vapor deposition (PVD) process.

In some embodiments, the gate electrode 145 may include a first gate electrode and a second gate electrode, made of different materials. The first gate electrode may adjust a work function, and a space formed above the first gate electrode may be filled. For example, the first gate electrode may include a metal nitride such as a titanium nitride film (TiN), a tantalum nitride film (TaN), or a tungsten nitride film (WN), and the second gate electrode may include aluminum (Al), tungsten (W), molybdenum (Mo), or the like, or a semiconductor material such as a doped polysilicon. For example, the gate capping layer 147 may be formed of an insulating material such as silicon nitride, or the like.

The above-described embodiments may be changed and implemented variously. For example, a width of the trench, a position of the conductive through structure, and/or a configuration of the buried conductive wiring may be changed variously in accordance with embodiments of the present disclosure.

Figure 5:
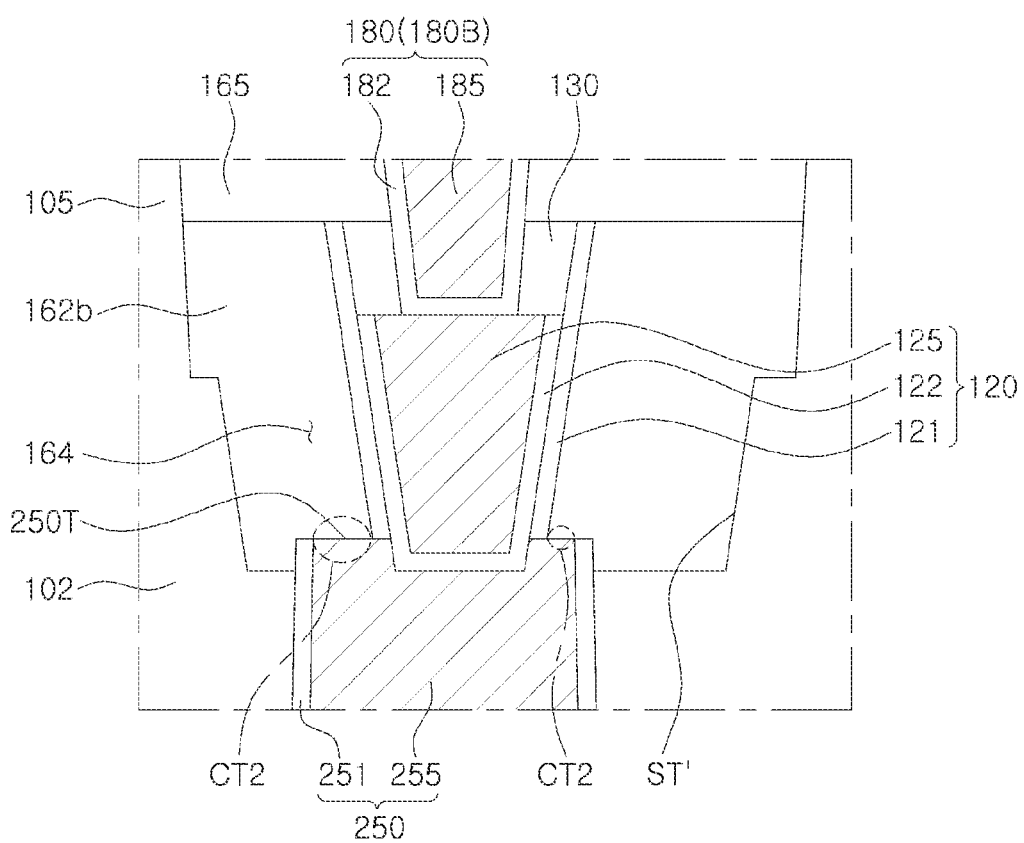
FIG. 5 is a cross-sectional view illustrating a semiconductor device according to an example embodiment.

FIG. 5 is a cross-sectional view illustrating a semiconductor device according to an example embodiment, and will be understood as the enlarged cross-sectional view of portion "A1" of the semiconductor device illustrated in FIG. 2, similar to the enlarged view illustrated in FIG. 3.

Referring to FIG. 5, it will be understood that a semiconductor device 100B has a structure similar to the semiconductor device 100A illustrated in FIGS. 1 to 3, except that a width of a trench ST' is further extended, and a position of an upper end of a conductive through structure 250 and a configuration of a buried conductive wiring 120 are changed. In addition, components of this embodiment can be understood with reference to the description of the same or similar components of the semiconductor device 100A illustrated in FIGS. 1 to 3, unless otherwise specified.

The semiconductor device 100B according to this embodiment may include a trench ST' having an extended width that is greater than the trench ST of the previous embodiment. The trench ST' employed in this embodiment may have an expanded width (e.g., a first width), adjacent to a lower end of a plurality of active fins 105 that is greater than another width (e.g., a second width adjacent to the buried conductive wiring 120). In this case, since a filling insulation portion 164 disposed around the buried conductive wiring 120 in the trench ST' may also have a relatively large width, a margin larger or wider than a margin of the previous embodiment may be provided during a landing process of the buried conductive wiring 250. A contact area CT2 between the conductive through structure 250 and the filling insulation portion 164 may be asymmetric with respect to (e.g., on opposing sides of) the buried conductive wiring 120.

An upper end or end portion of the conductive through structure 250 may be located higher than or extend beyond a bottom surface of the buried conductive wiring 120. A through-hole for the conductive through structure 250 may be formed such that a portion of a side surface of the buried conductive wiring 120, in addition to the bottom surface of the buried conductive wiring 120, is exposed for stable connection with the buried conductive wiring 120.

The buried conductive wiring 120 may include a conductive material 125, and a conductive barrier 122 disposed on a lower surface of the conductive material 125, and may further include a dielectric barrier 121 disposed between the conductive barrier 122 and the filling insulation portion 164. For example, the dielectric barrier 121 may include $SiO_2$, SiN, SiCN, SiC, SiCOH, SiON, $Al_2O_3$, AlN, or porous materials thereof.

In the foregoing embodiments, a method of forming a shallow trench insulator (STI) having a trench and a filling insulation portion in an active region adjacent to an active fin, and filling a conductive wiring using the filling insulation portion, may be provided. Since the filled insulation portion is located around the buried conductive wiring, even when the conductive through structure is disposed out of or otherwise misaligned with the buried conductive wiring, it may be prevented from being short-circuited with the active region due to contact with the filling insulation portion.

Although the foregoing embodiments are illustrated as a three-dimensional semiconductor device having a plurality of active fins, the disclosure may be advantageously implemented also in a planar semiconductor device having an active region without an active fin. For example, a trench having a larger width than the buried conductive wiring may be formed in the active region and a filling insulation portion for filling the trench may be formed to be disposed around the buried conductive wiring, to suppress or provide a margin of error around the active region and reduce the likelihood of shorting by the conductive through structure.

Alternatively, a dielectric liner may be formed using selective deposition on the inner surface of the through-hole for the conductive through structure, as a modification to prevent shorting of the conductive through structure and the active region. The selective deposition may not form the dielectric liner on a surface of the buried conductive wiring exposed in the through-hole, but the dielectric liner may be formed only on a surface of a semiconductor (a surface of a substrate and an active region) to be in contact with the conductive material of the conductive through structure. Various embodiments according to such a modification may be described in detail with reference to FIGS. 6 to 9.

Figure 6:
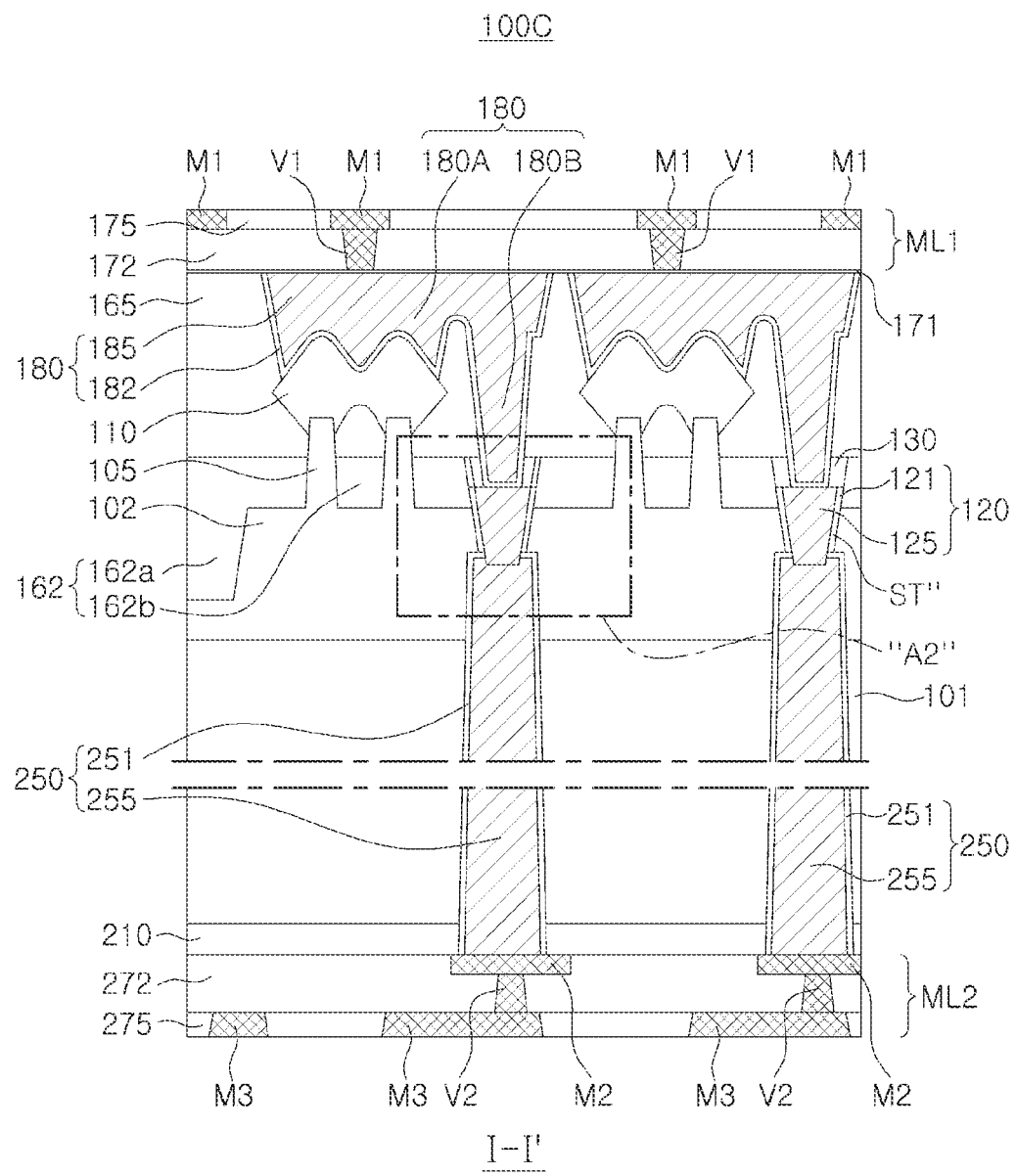
FIG. 6 is a cross-sectional view illustrating a semiconductor device according to an example embodiment.
Figure 7:
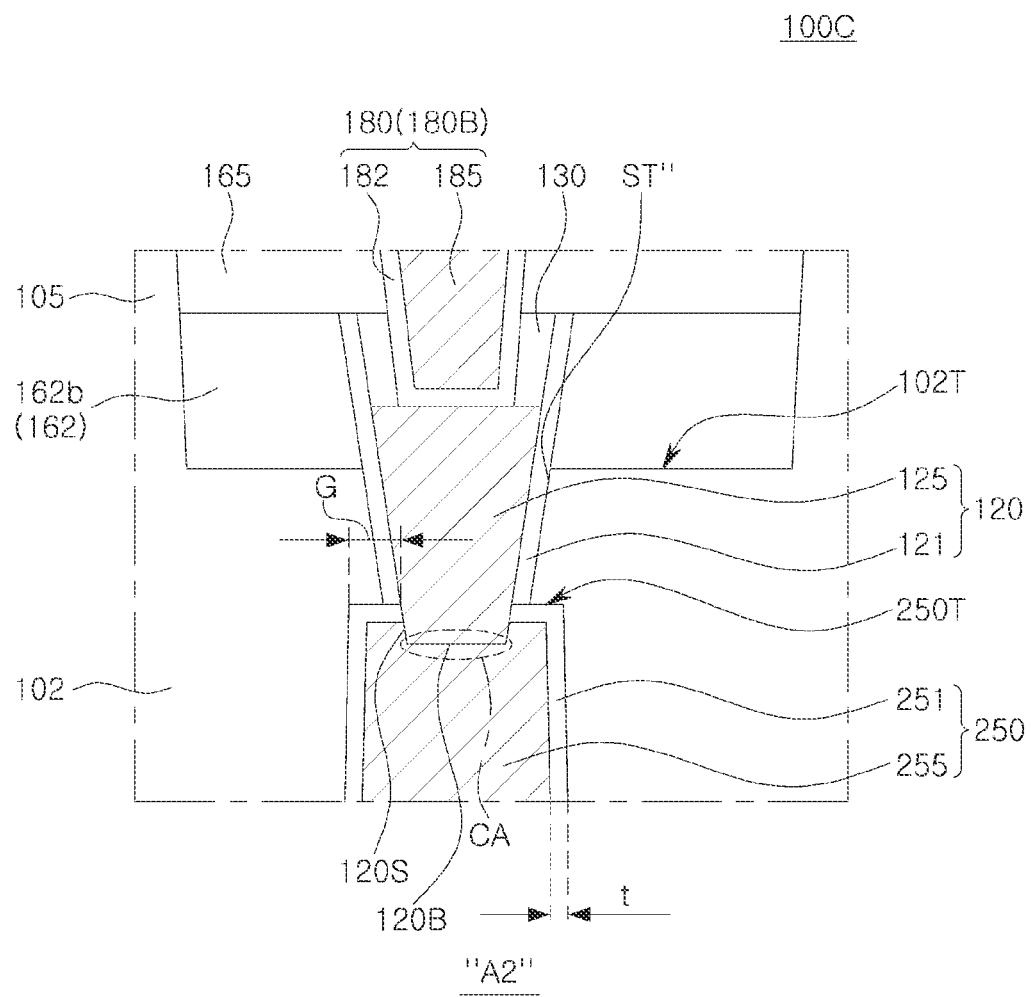
FIG. 7 is an enlarged cross-sectional view illustrating portion "A2" of the semiconductor device illustrated in FIG. 6.

FIG. 6 is a cross-sectional view illustrating a semiconductor device according to an example embodiment, and FIG. 7 is an enlarged cross-sectional view illustrating portion "A2" of the semiconductor device illustrated in FIG. 6. In this case, the cross-sectional view illustrated in FIG. 6 will be understood as a cross-sectional view of the planar layout illustrated in FIG. 1, taken along line I-I'.

Referring to FIGS. 6 and 7, a semiconductor device 100C according to this embodiment may include a substrate 101 having an active region 102, similar to the embodiment illustrated in FIGS. 2 and 3. A plurality of active fins 105 may be arranged on an upper surface of the active region 102.

It will be understood that the semiconductor device 100C has a structure similar to the semiconductor device 100A illustrated in FIGS. 1 to 3, except that a peripheral structure of a buried conductive wiring 120 and a dielectric liner 251 of a conductive through structure 250 are changed. In addition, components of this embodiment can be understood with reference to the description of the same or similar components of the semiconductor device 100A illustrated in FIGS. 1 to 3, unless otherwise specified.

Each of the plurality of active fins 105 may have a structure protruding from the upper surface of the active region 102 in the upper direction (e.g., the z direction). The plurality of active fins 105 may be arranged side by side on the upper surface of the active region 102 to extend in the first direction (e.g., the y direction). A source/drain region 110 may be formed in a portion of the active fin 105 located on both sides of a gate structure (not illustrated). The gate structure in this embodiment is not illustrated, but can be understood with reference to the cross-sectional view of FIG. 1, taken along line as shown in FIG. 2.

The source/drain region 110 may form a recess in a partial region of the active fins 105, and may have an upper surface having a level higher than the upper surface of the active fin 105 by selective epitaxial growth on the recess.

The semiconductor device 100C may include an device isolation layer 162 and an interlayer insulation layer 165, similar to the previous embodiment. The device isolation layer 162 may include a first isolation region 162a defining the active region 102, and a second isolation region 162b defining the active fin 105. The second isolation region 162b may be disposed on the upper surface of the active region 102. The active fin 105 may penetrate the second isolation region 162b, and a portion of the active fin 105 may protrude from the second isolation region 162b.

Referring to FIGS. 6 and 7, a trench ST" employed in this embodiment may be formed to penetrate the device isolation layer 162, particularly, the second isolation region 162b and extend to a partial region of or partially into the active region 102. In a final structure, the buried conductive wirings 120 may be disposed in the trench ST" located in the active region 102 adjacent to the plurality of active fins 105 and embedded in the trench ST' by the device isolation layer 162 and an insulation capping layer 130.

In a similar manner to the previous embodiments, the trench ST" may be disposed between the plurality of active fins 105, and may extend in the first direction, similarly to the active fin 105. The buried conductive wiring 120 may extend in the first direction along a bottom surface of the trench ST". The trench ST" employed in this embodiment may be formed to be shallower than the first isolation region 162a, but deeper than the second isolation region 162b.

Referring to FIGS. 6 and 7, the buried conductive wiring 120 may include a conductive material 125, and a dielectric barrier 121 disposed between the conductive material 125 and the active region 102. The dielectric barrier 121 may be illustrated at the same height as the conductive material 125, but may extend further along an inner wall of the trench ST" of the device isolation layer 162. The conductive through structure 250 may extend from a rear surface of the substrate 101 to the trench ST", and may be connected to the buried conductive wiring 120. For example, the conductive through structure 250 may be a TSV.

As illustrated in FIG. 7, an upper end 250T of the conductive through structure 250 may be located lower than an upper surface 102T of the active region 102. In this embodiment, the conductive through structure 250 may be not formed up to (i.e., may be confined below) the upper surface 102T of the active region 102. Therefore, a sufficient distance from the active fin 102 may be secured to suppress mutual electrical interference.

The upper end 250T of the conductive through structure 250 may be located higher than a bottom surface 120B of the buried conductive wiring 120. In this arrangement, the bottom surface 120B of the buried conductive wiring 120 as well as a portion of side surfaces 120S of the buried conductive wiring 120, adjacent thereto, may be in contact with the conductive through structure 250. In FIG. 7, "CA" refers to a contact area between the conductive material 125 of the buried conductive wiring 120 and the conductive material 255 of the conductive through structure 250.

The dielectric liner 251 employed in this embodiment may be disposed on a side surface of the conductive through structure 250 as well as on a surface of the active region 102 adjacent to the upper end 250T. This dielectric liner 251 may be formed using a selective deposition process.

The selective deposition process employed in this embodiment refers to a process in which an insulating material is only deposited on a surface of a semiconductor such as Si, not on a surface of a conductive material 125 such as a metal. This selective deposition process may be a process that may be relatively conformally deposited at the entire of an inner surface of a through-hole. For example, the selective deposition process may be performed by an atomic layer deposition (ALD) process.

Figure 13A:
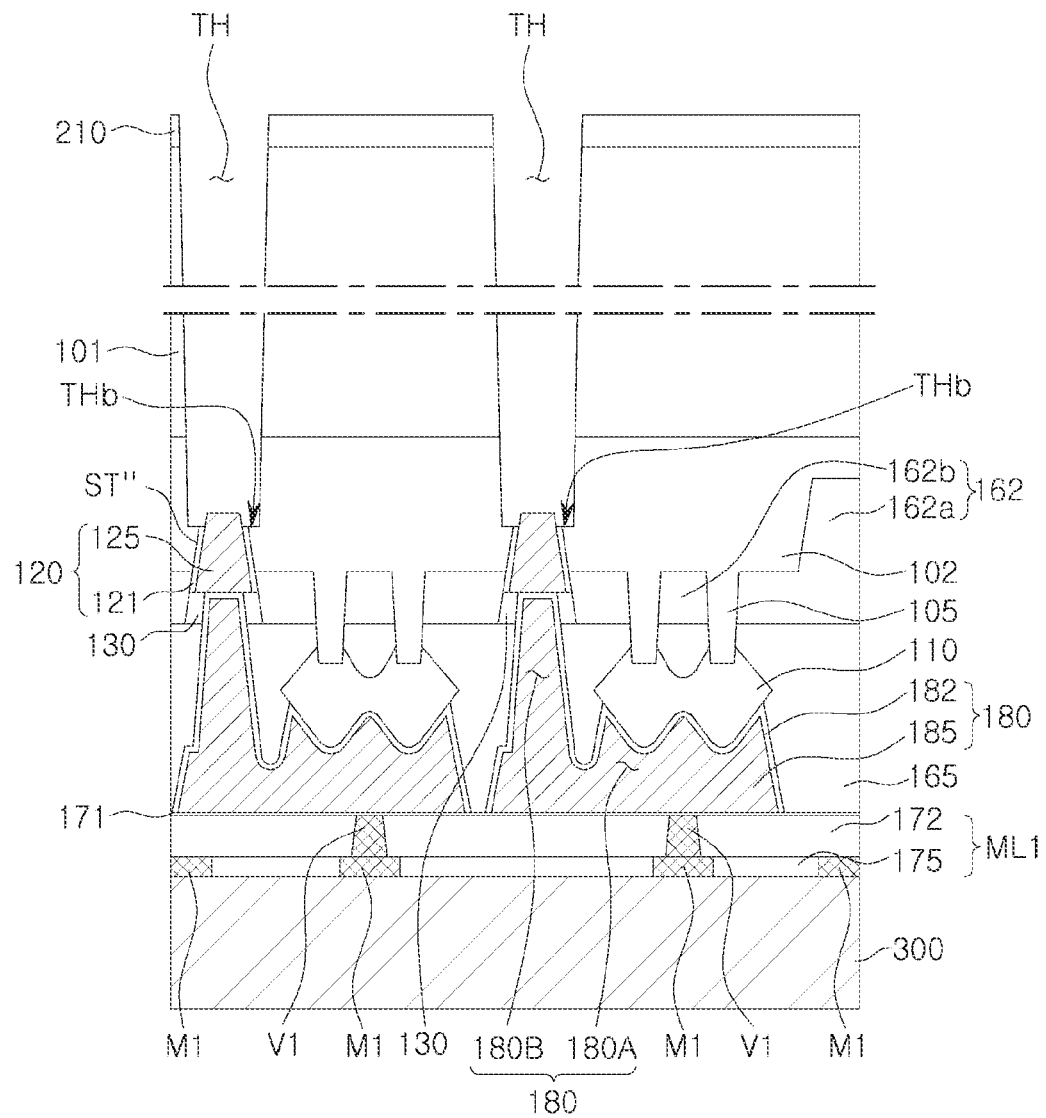
FIGS. 13A to 13C are cross-sectional views of processes illustrating a method of manufacturing the semiconductor device illustrated in FIG. 6 (a method of forming a conductive through structure and a second wiring portion).
Figure 13B:
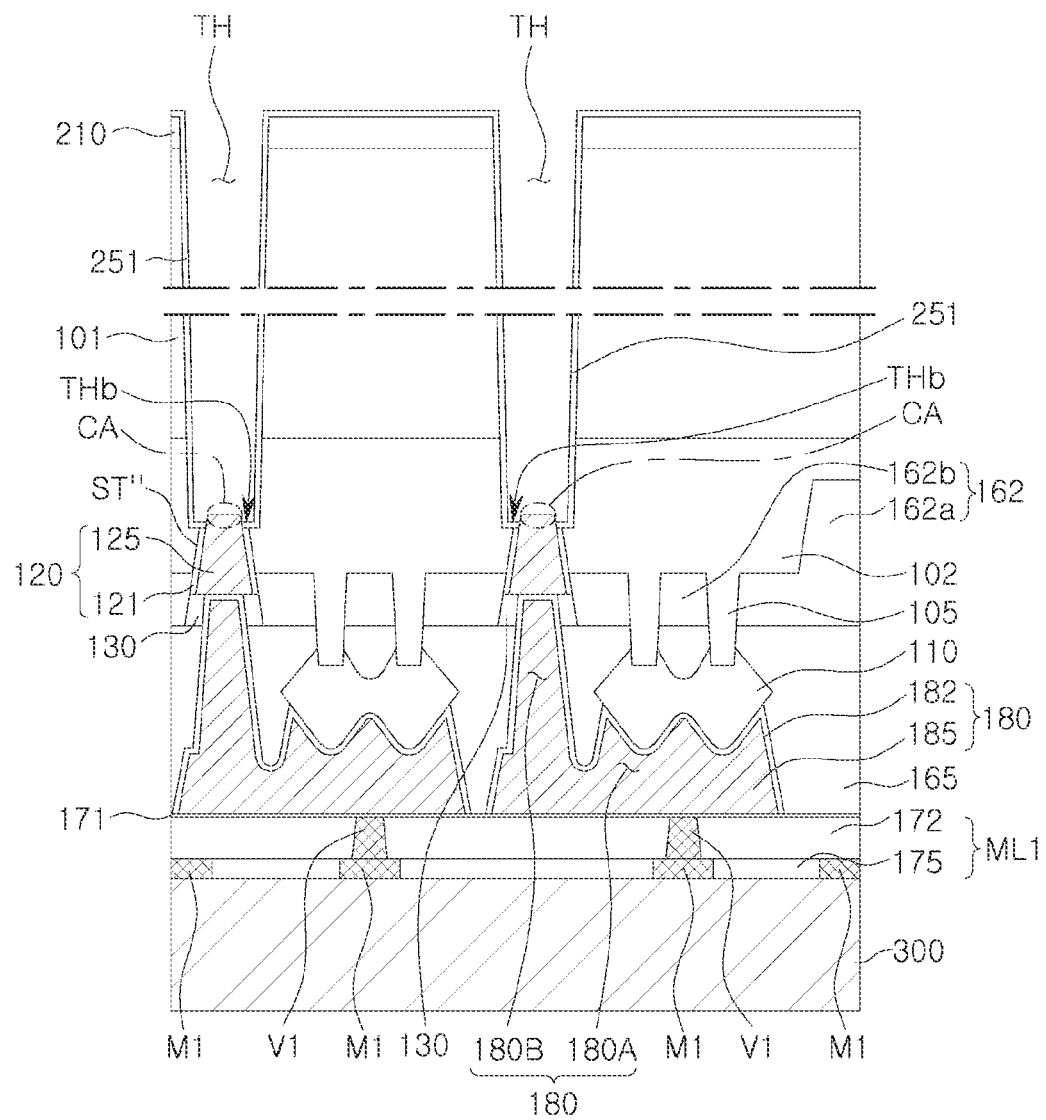

In contrast to the conventional process of forming the dielectric liner 251 on the entire surface of the through-hole for the conductive through structure 250, the active region 102 located on the bottom surface around the contact may be exposed (see FIGS. 11B and 11C), and the dielectric liner employed in this embodiment may be formed using the selective deposition process on the semiconductor (the surface of the substrate 101 and the surface of the active region 102) exposed to the inner surface of the through-hole, for example, the side surface of the through-hole and the bottom surface of the through-hole, excluding the buried conductive wiring 120 (see FIGS. 13A and 13B). The dielectric liner 251 may have a uniform thickness. For example, the dielectric liner 251 may include $SiO_2$, SiN, SiCN, SiC, SiCOH, SiON, $Al_2O_3$, AlN or HfN.

Even when a size of the conductive through structure 250 is greater than a width of the buried conductive wiring 120 or the conductive through structure 250 is not aligned correctly, the conductive through structure 250 may not be in contact with adjacent active regions (e.g., Si) through or due to the presence of the dielectric liner 251.

In this embodiment, the exposed surface of the active region 102 may have a sufficient area to uniformly deposit the dielectric liner 251 on a surface of the active region 102 exposed on or by the bottom surface of the through-hole. In some embodiments, the exposed surface of the active region 102 may have a gap G that may be thicker than twice a thickness (t) of the dielectric liner 251.

The buried conductive wiring 120 may be connected to the contact structure 180 penetrating the interlayer insulation layer 165. The interlayer insulation layer 165 may be disposed on the device isolation layer 162 to cover the source/drain region 110 and the buried conductive wiring 120. The insulation capping layer 130 may have an upper surface 130T that may be a substantially flat surface that may be coplanar with an upper surface 162T of the device isolation layer 162.

The buried conductive wiring 120 employed in this embodiment may have an upper surface higher than the upper surface 102T of the active region 102, and lower than the upper end of the active fin 105. The buried conductive wiring 120 may not be exposed externally in the process of forming the source/drain 110.

The buried conductive wiring 120 may be electrically connected by the contact structure 180. The contact structure 180 employed in this embodiment may electrically connect the source/drain region 110 and the buried conductive wiring 120. In particular, the contact structure 180 may include a first contact area 180A connected to the source/drain region 110, and a second contact area 180B connected to the contact area 180A and connected to the buried conductive wiring 120.

In this embodiment, the contact structure 180 may be electrically connected to a first wiring portion ML1 constituting a back end of line (BEOL). The first wiring portion ML1 may include a plurality of low dielectric layers 172 and 175, a plurality of metal wirings M1, and a plurality of metal vias V1, and may further include an etch stop layer 171 disposed between the interlayer insulation layer 165 and the first low dielectric layer 172.

The contact structure 180 connected to a plurality of elements (for example, the source/drain region 110, and the like) formed on the substrate 101 may be connected to a second wiring portion ML2 located on the rear surface of the substrate 101, via the buried conductive wiring 120 and the conductive through structure 250. In this case, since the second wiring portion ML2 is located on the rear surface of the substrate 101, the second wiring portion ML2 may be also referred to as a "backside wiring portion." The second wiring portion ML2 may provide a signal line and a power line for a plurality of elements (for example, transistors) implemented on the upper surface of the substrate 101, through the buried conductive wiring 120 and the conductive through structure 250.

Figure 8:
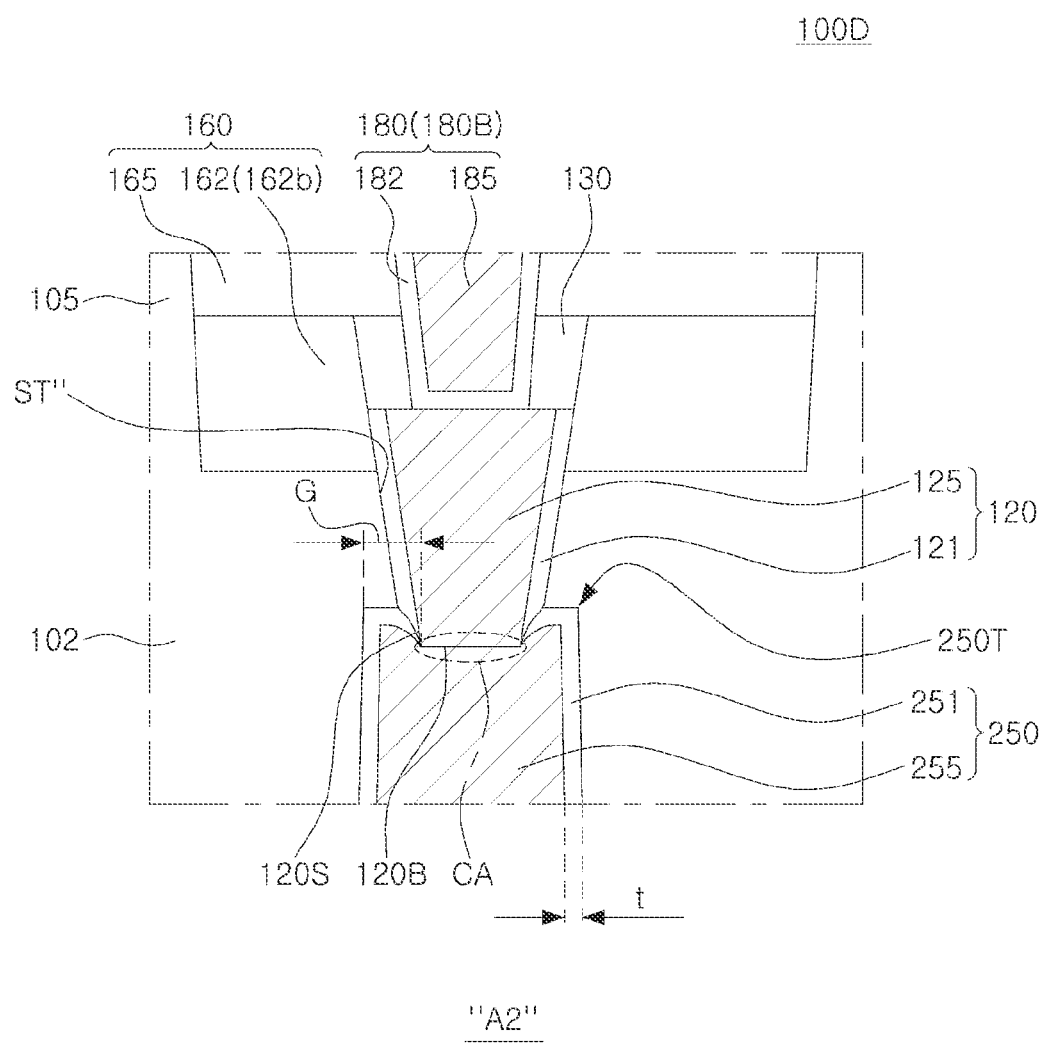
FIG. 8 is a cross-sectional view illustrating a semiconductor device according to an example embodiment.

FIG. 8 is a cross-sectional view illustrating a semiconductor device according to an example embodiment.

Referring to FIG. 8, it will be understood that a semiconductor device 100D has a structure similar to the semiconductor device 100C illustrated in FIGS. 6 and 7, except that a configuration of a buried conductive wiring 120 and a formation region of a dielectric liner 251 accordingly are changed. Further, components of this embodiment can be understood with reference to the description of the same or similar components of the semiconductor device 100C illustrated in FIGS. 6 and 7, unless otherwise specified.

In a similar manner to the example illustrated in FIG. 7, since the upper end 250T of the conductive through structure 250 is located higher than the bottom surface 120B of the buried conductive wiring 120, a conductive through structure 250 may be formed on a bottom surface 120B of a buried conductive wiring 120 and a portion of a side surface 120S of the buried conductive wiring 120, adjacent thereto.

In the previous embodiment (FIG. 7), since the dielectric barrier 121 is removed from the side surface 120S of the buried conductive wiring 120 to expose the side surface of the conductive material 125, the dielectric liner 251 may not be formed on a side surface of the dielectric barrier 121. In this embodiment, since a dielectric barrier 121 at least partially remains on the side surface 120S of the buried conductive wiring 120, a dielectric liner 251 may be formed on the remaining surface of the dielectric barrier 121. In this case, a conductive material 125 of the buried conductive wiring 120 may be exposed at the bottom surface 120B, and thus, may be in contact with a conductive material 255 of the conductive through structure 250, to provide a contact area CA.

A first modification (using a filling insulation portion) and a second modification (using a selective deposition process) of the above embodiments may be implemented in combination. A semiconductor device according to this embodiment may be illustrated in FIG. 9.

Figure 9:
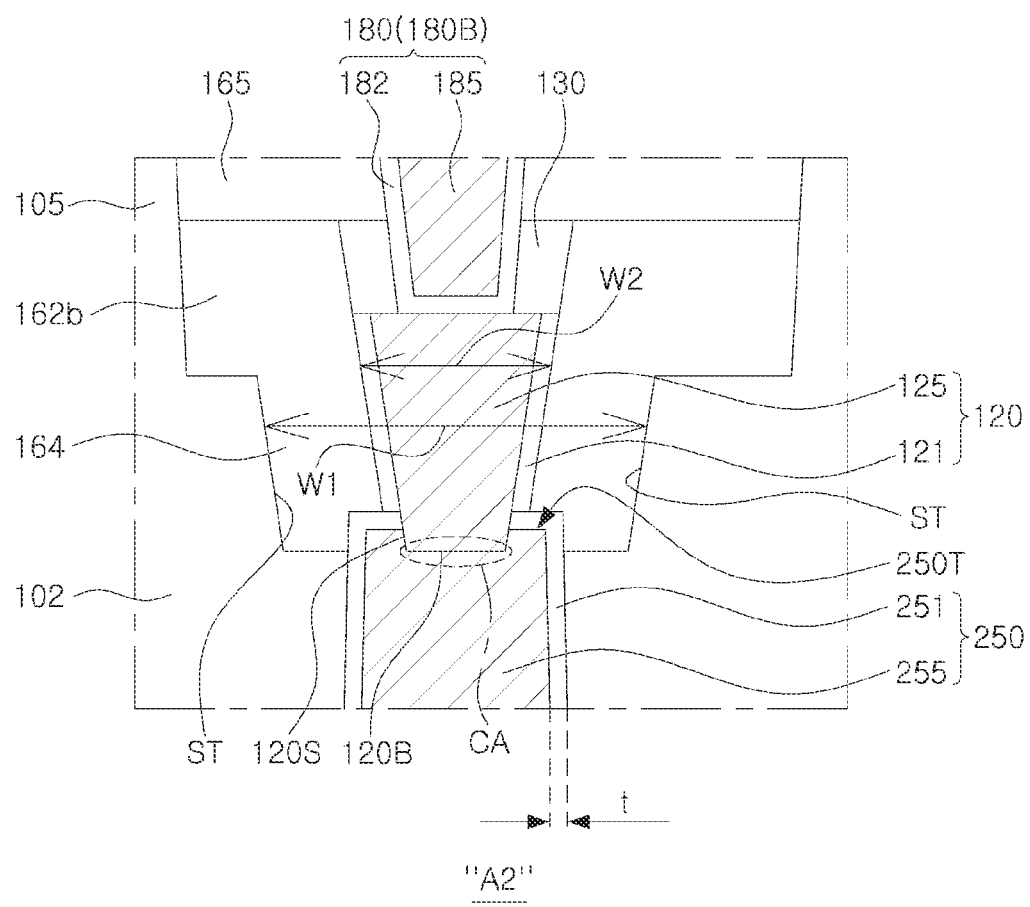
FIG. 9 is a cross-sectional view illustrating a semiconductor device according to an example embodiment.

Referring to FIG. 9, it will be understood that a semiconductor device 100E has a structure similar to the semiconductor device 100A illustrated in FIGS. 1 to 3 and the semiconductor device 100C illustrated in FIGS. 6 and 7, except that a configuration of a buried conductive wiring 120 and a formation region of a dielectric liner 251 accordingly are changed. Further, components of this embodiment can be understood with reference to the description of the same or similar components of the semiconductor device 100A illustrated in FIGS. 1 to 3 and the semiconductor device 100C illustrated in FIGS. 6 and 7, unless otherwise specified.

In a similar manner to the example illustrated in FIGS. 2 and 3, a trench ST may have a width W1 wider than a width W2 of a buried conductive wiring 120. An device isolation layer 162 may have a filling insulation portion 164 extending between the trench ST and the buried conductive wiring 120. The filling insulation portion 164 may be disposed around the buried conductive wiring 120 in the trench ST.

Since an upper end 250T of a conductive through structure 250 is located higher than a bottom surface 120B of the buried conductive wiring 120, the conductive through structure 250 may be formed on the bottom surface 120B of the buried conductive wiring 120, and side surfaces 120S of the buried conductive wiring 120, adjacent thereto. In a similar manner to the example illustrated in FIGS. 6 and 7, a dielectric liner 251 may also be extended to an upper end 250T of the conductive through structure 250. This dielectric liner 251 may be formed by a selective deposition process.

Even when the dielectric liner 251 may not be smoothly formed (e.g., may not continuously extend) on a bottom surface of a through-hole, the filling insulation portion 164 located around the buried conductive wiring 120 in the trench ST may reduce or prevent undesired shorts of the conductive through structure 250 and the active region 102.

Hereinafter, a method of manufacturing a semiconductor device according to an example embodiment will be described with reference to the accompanying drawings. In a course of describing this manufacturing method, the structural characteristics of a semiconductor device according to an example embodiment and advantages therefrom will be understood in more detail.

A method of manufacturing the semiconductor device 100A illustrated in FIG. 1 will be divided into a process for forming a device portion and a first wiring portion (FIGS. 10A to 10G), and a process for forming a conductive through structure and a second wiring portion (FIGS. 11A to 11E), and will be explained separately. FIGS. 10A to 10G are cross-sectional views of processes illustrating a method of manufacturing the semiconductor device illustrated in FIG. 1 (a method of forming a device portion and a first wiring portion).

Figure 10A:
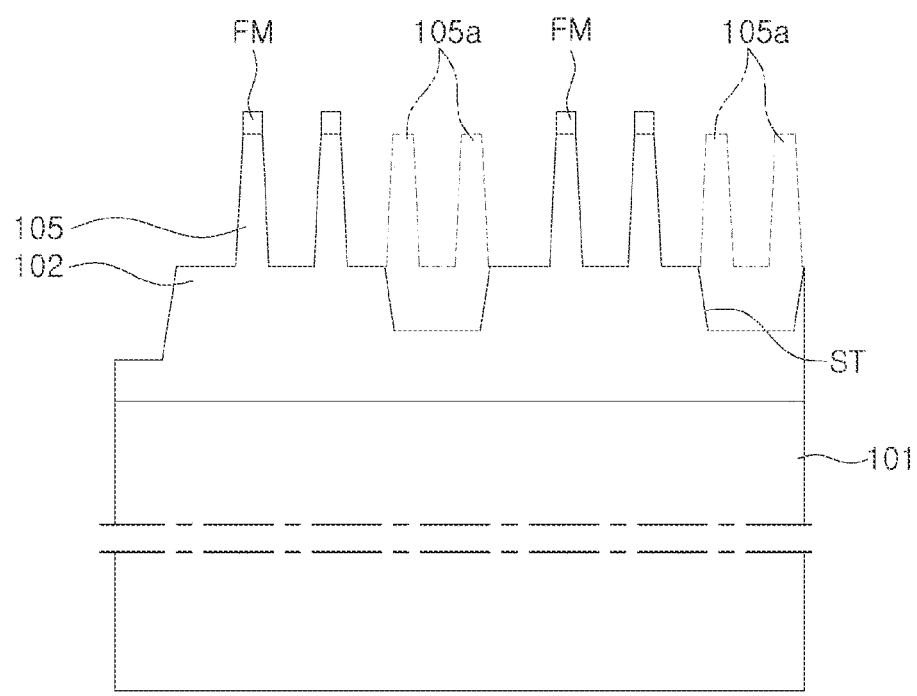
FIGS. 10A to 10G are cross-sectional views of processes illustrating a method of manufacturing the semiconductor device illustrated in FIG. 1 (a method of forming a device portion and a first wiring portion).

First, referring to FIG. 10A, a trench ST for a buried conductive wiring may be formed in an active region 102 adjacent to a plurality of active fins 105.

A fin mask FM may be disposed on an upper surface of each of the plurality of active fins 105. The fin mask FM may be a mask that has been used in an operation for forming the plurality of active fins 105 prior to this operation. The trench ST may be formed to extend in a first direction in which the plurality of active fins 105 extend. A formation region of the trench ST may be located between ones of the plurality of active fins 105. A portion of the active fins 105a may be removed together with a portion of the active region 102, as indicated by dotted lines in the formation of the trench ST.

Figure 10B:
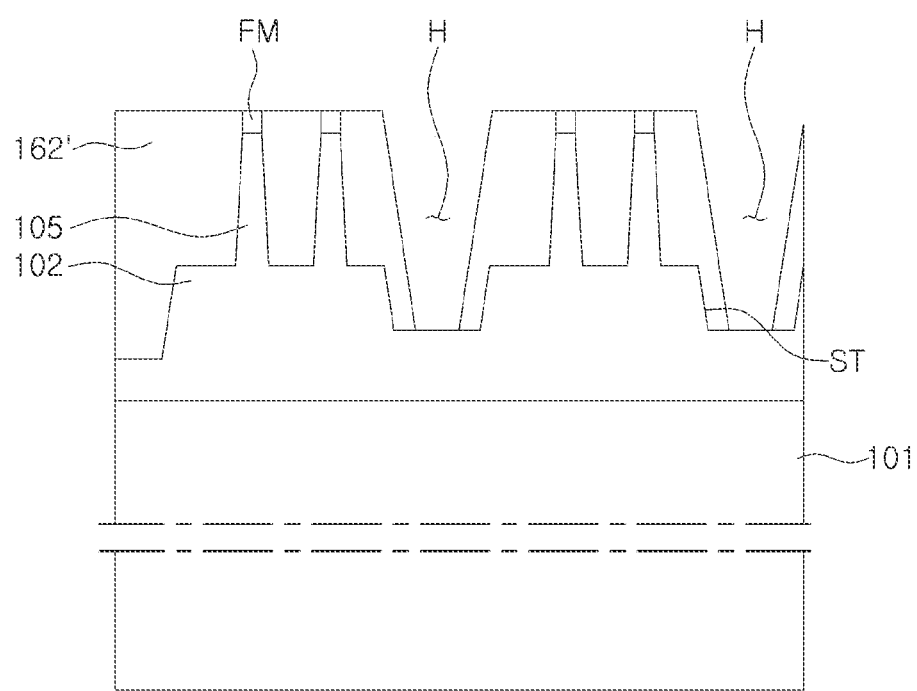

Referring to FIG. 10B, a first insulation layer 162' may be formed, and a hole H for buried conductive wiring may be formed in the first insulation layer 162'.

The first insulation layer 162' may be formed to cover the plurality of active fins 105 on a substrate 101. In this operation, after the first insulation layer 162' is formed to cover the fin mask FM, the first insulation layer 162' may be planarized using an operation such as CMP to expose the fin mask FM. The first insulation layer 162' may be used as a device isolation layer 162 in the final structure. The hole H for opening and exposing the bottom surface of the trench ST may be formed in the first insulation layer 162'. A bottom surface of the trench ST exposed by the hole H may be provided by the active region 102.

Figure 10C:
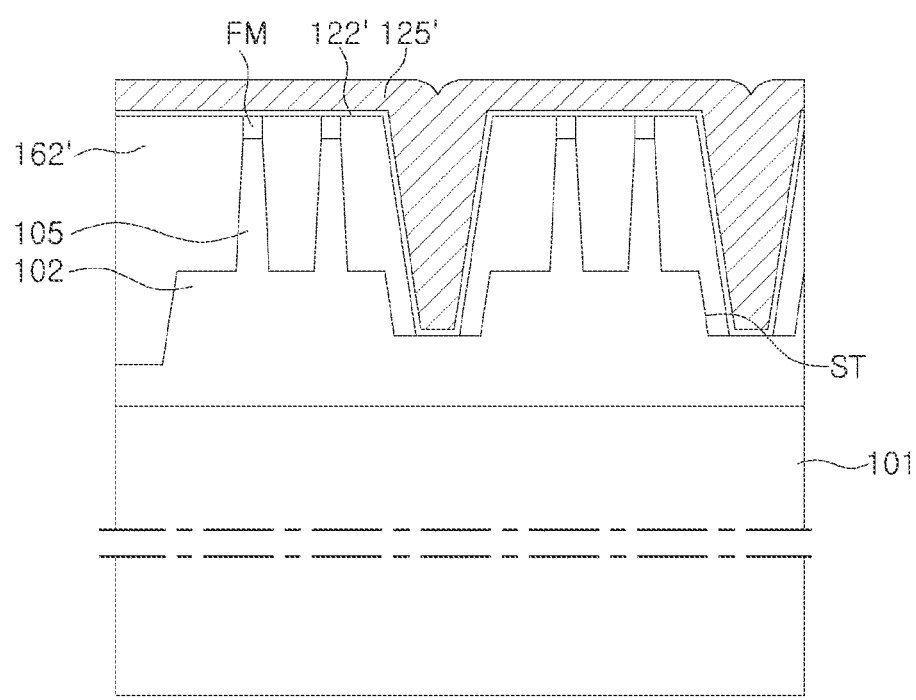

Referring to FIG. 10C, a conductive barrier 122' and a conductive material 125' may be sequentially deposited to fill the hole H.

The conductive barrier 122' and the conductive material 125' may be formed on an upper surface of the first insulation layer 162' to be filled in the hole H. In some embodiments, a dielectric barrier may be formed together with (see FIG. 5) or instead of the conductive barrier 122'. When the dielectric barrier is formed, after deposition of the dielectric barrier, and prior to deposition of the conductive material, an operation (e.g., an etch-back operation) in which a portion of the dielectric barrier located on the bottom surface of the trench ST is removed to expose the active region 102, may be performed additionally.

Figure 10D:
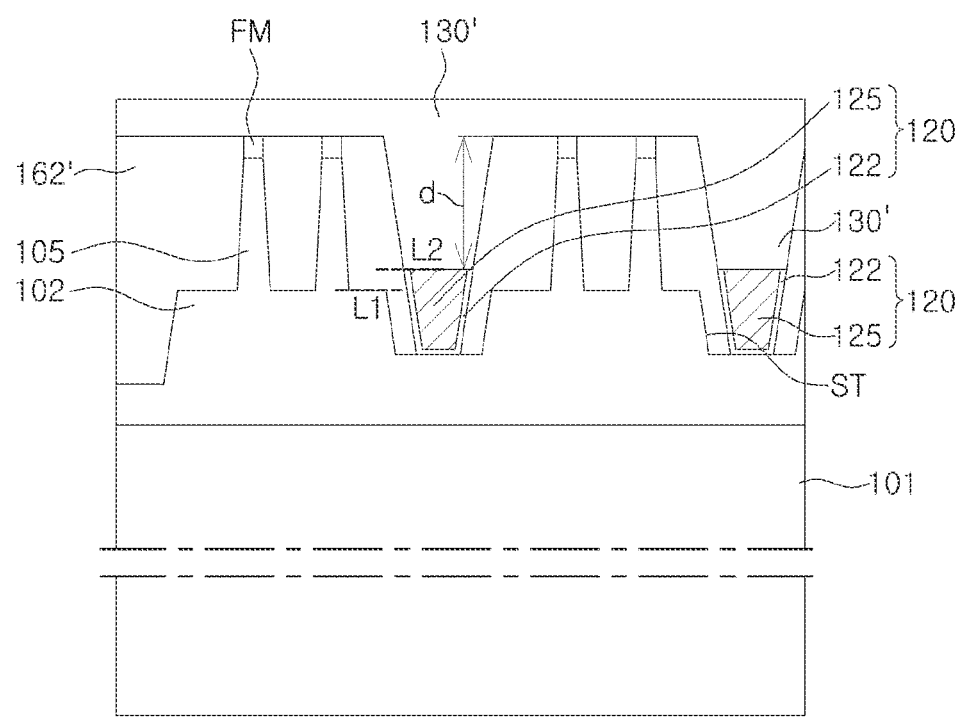

Referring to FIG. 10D, a buried conductive wiring 120 having a predetermined height may be formed in the hole H, and a second insulation layer 130' may be formed to embed the buried conductive wiring 120 in the trench ST.

Portions of the conductive barrier 122' and the conductive material 125' disposed on the upper surface of the first insulation layer 162' may be removed by applying an etch-back operation or a planarization operation, and an etch-back operation, and portions of the conductive barriers 122' and the conductive material 125' located in the hole H may be lowered to or by a predetermined depth (d), to form the buried conductive wiring 120. An upper surface level L2 of the buried conductive wiring 120 may be higher than an upper surface level L1 of the active region 102 and lower than the upper end of the active fin 105. The second insulation layer 130' may be formed to fill the hole H to define the buried conductive wiring 120.

Figure 10E:
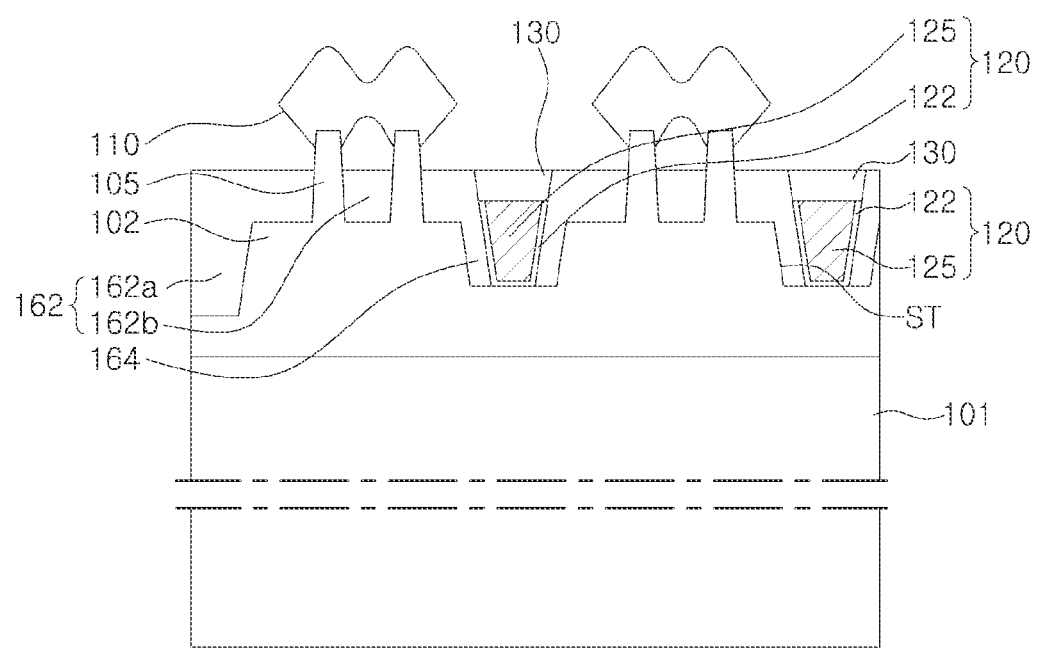

Referring to FIG. 10E, a portion of the second insulation layer 130' and a portion of the first insulation layer 162' may be removed to expose portions of the plurality of active fins 105, and a source/drain region 110 may be formed on the exposed portions of the plurality of active fins 105.

In this operation, the portions of the second insulation layer 130' and the first insulation layer 162' may be removed using a planarization operation such as CMP. This operation may be performed until the fin mask FM is exposed. After removing the fin mask FM, an etch-back operation may be performed to remove the portions of the first and second insulation layers 162' and 130', to expose respective portions of the plurality of active fins 105. The first insulation layer 162' obtained by this operation may be provided as a device isolation layer 162, and the second insulation layer 130' may be provided as an insulation capping layer 130. A recess may be formed in the exposed portion of the plurality of active fins 105, and a selective epitaxial growth operation may be performed in the recess to form the source/drain region 110.

Figure 10F:
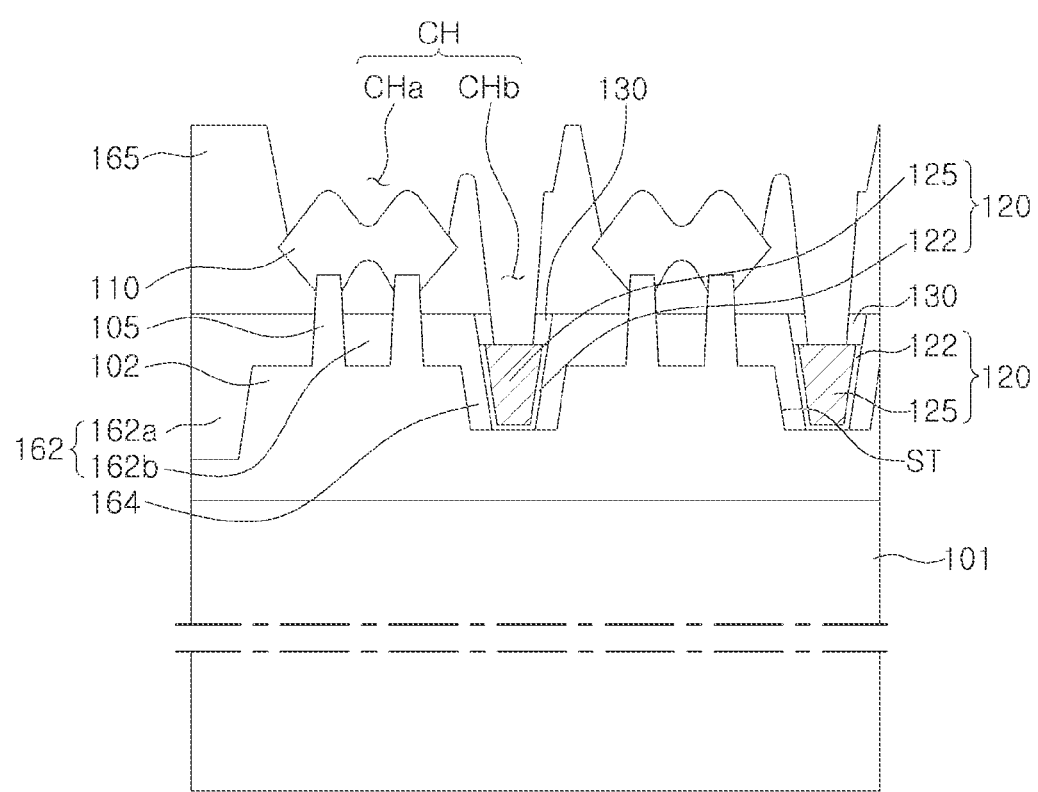

Referring to FIG. 10F, an interlayer insulation layer 165 may be formed, and a contact hole CH for a contact structure may be formed.

The interlayer insulation layer 165 may be formed to cover the source/drain region 110, and the contact hole CH may be formed. The contact hole CH may include a first hole region CHa connected to the source/drain region 110, and a second hole region CHb connected to the first hole region CHa and connected to the buried conductive wiring 120. The second hole region CHb may be formed deeper than the first hole region CHa, and may be electrically connected to the buried conductive wiring 120.

Figure 10G:
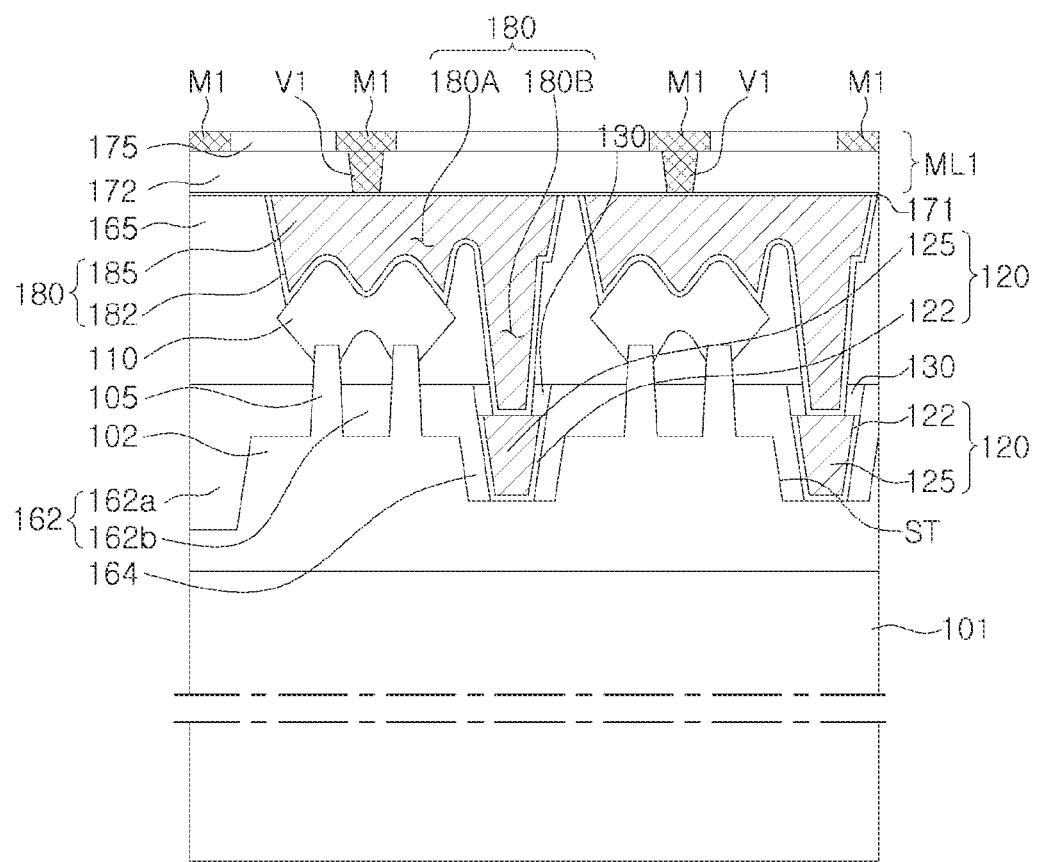

Referring to FIG. 10G, a contact structure 180 may be formed, and a first wiring portion ML1 may be formed on the interlayer insulation layer 165.

A conductive barrier 182 and a conductive material 185 may be sequentially formed to fill the contact hole CH, and then a planarization operation such as CMP may be performed to form a substantially flat coplanar surface between an upper surface of the contact structure 180 and an upper surface of the interlayer insulation layer 165.

The first wiring portion ML1 electrically connected to the contact structure 180 may be formed on the interlayer insulation layer 165. An etch stop layer 171 may be formed on the interlayer insulation layer 165, and the first wiring portion ML1 having a plurality of low dielectric layers 172 and 175, a plurality of metal wirings M1, and a plurality of metal vias V1 may be formed. The metal wiring M1 and the metal via V1 may be formed together using a dual damascene operation.

FIGS. 11A to 11E are cross-sectional views of processes illustrating a method of manufacturing the semiconductor device illustrated in FIG. 1 (a method of forming a conductive through structure and a second wiring portion).

Figure 11A:
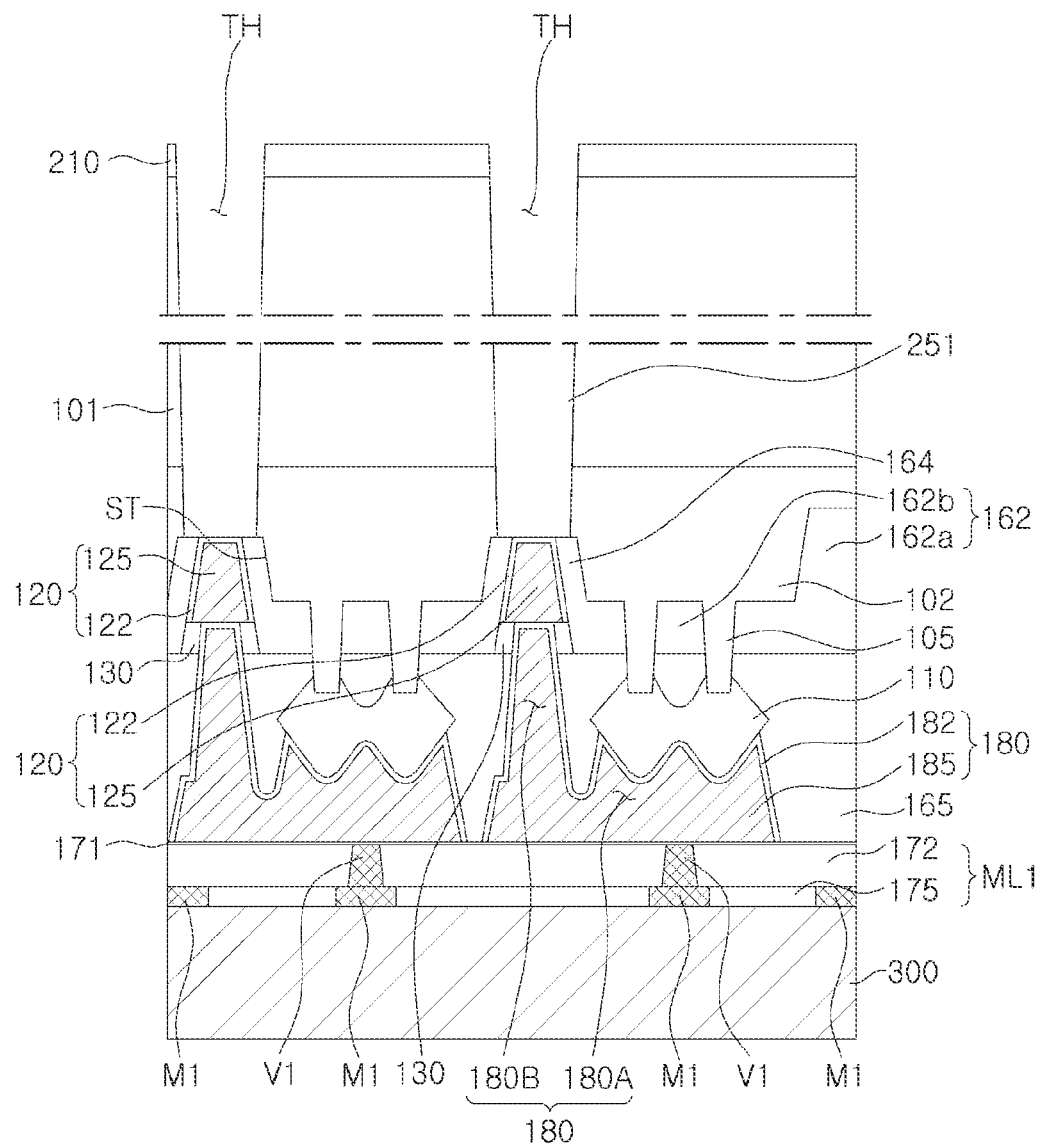
FIGS. 11A to 11E are cross-sectional views of processes illustrating a method of manufacturing the semiconductor device illustrated in FIG. 1 (a method of forming a conductive through structure and a second wiring portion).

Referring to FIG. 11A, the resultant structure prepared in FIG. 10G may be attached to a support substrate 300, and a through-hole TH may be formed in the substrate 101.

The supporting substrate 300 may be attached to the first wiring portion ML1 of the resultant structure, shown in FIG. 10G, to reverse a rear surface of the substrate 101 to face in an upward direction. A backside insulation layer 210 for passivation may be formed on the rear surface of the substrate 101. The through-hole TH may be formed to face the trench ST from or toward the rear surface of the substrate 101. The contact area of the buried conductive wiring 120 may be exposed from or by a bottom surface of the through-hole TH. When a size (e.g., a diameter) of the through-hole TH is greater than a width of the buried conductive wiring 120 or the through-hole TH is not aligned correctly, a portion of the filling insulation portion 164 located around the buried conductive wiring 120 may be exposed from or by the bottom surface of the through-hole TH.

Figure 11B:
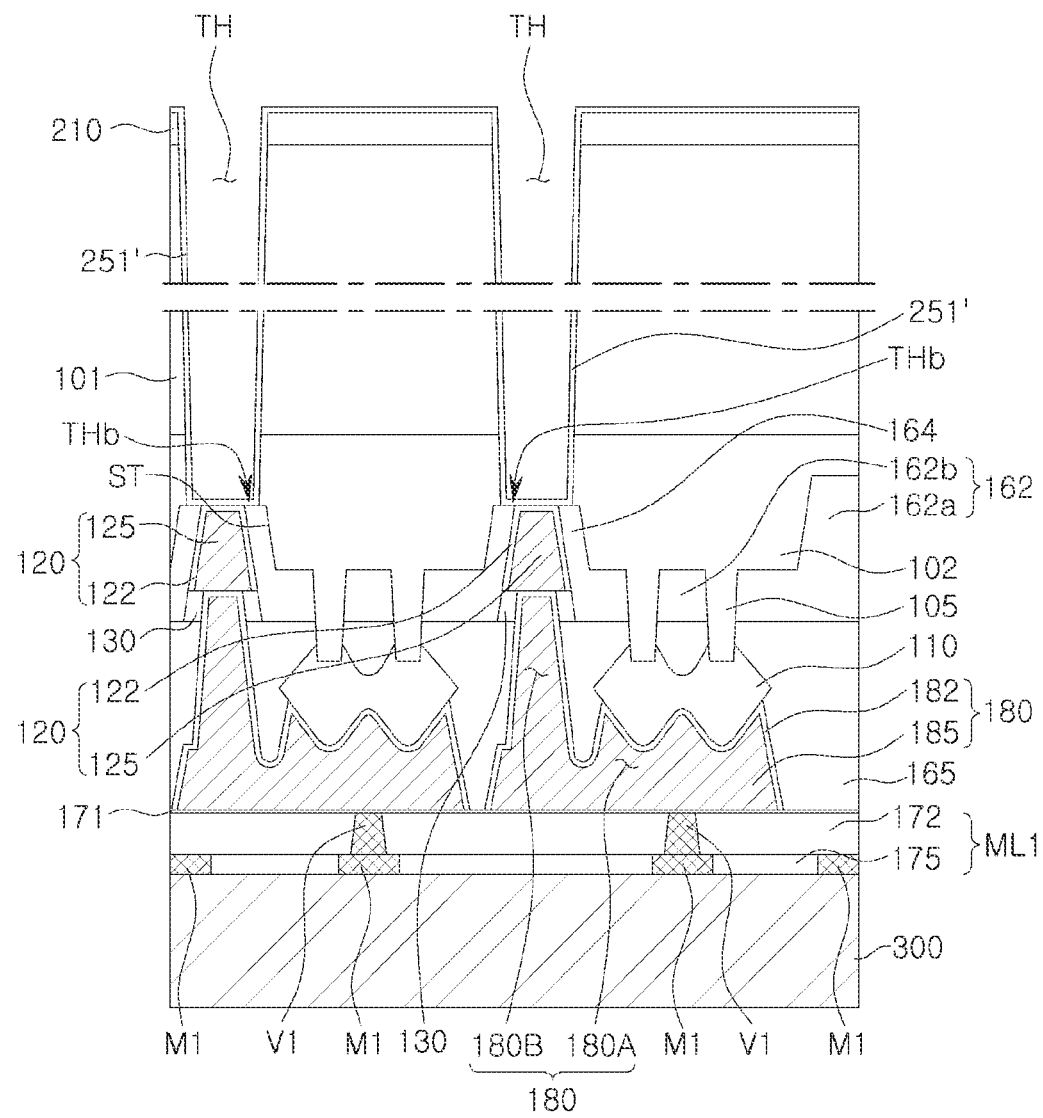
Figure 11C:
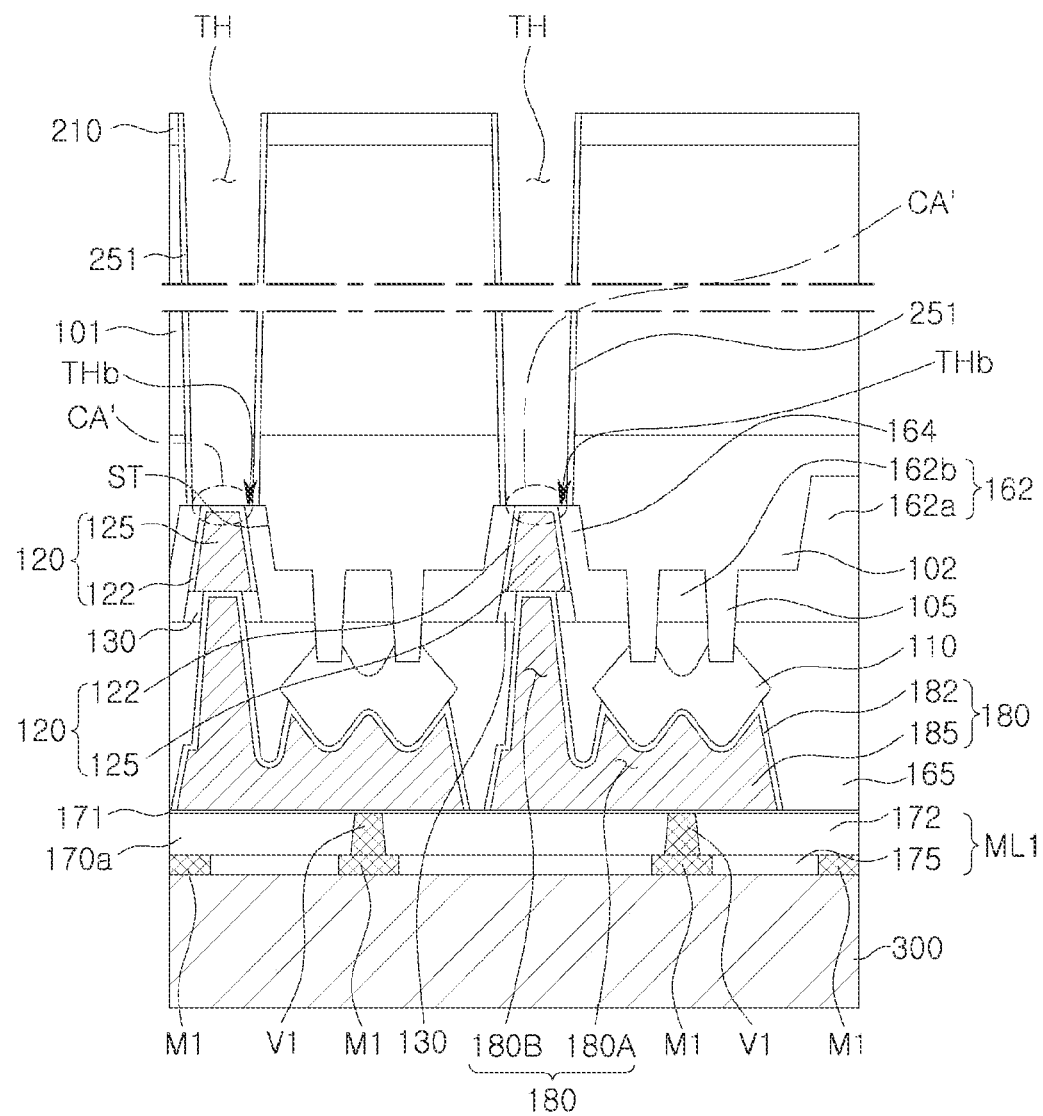

Referring to FIG. 11B, a dielectric layer 251' for a dielectric liner 251 may be formed. Referring to FIG. 11C, a portion of the dielectric layer 251' located on a bottom surface THb of the through-hole TH may be opened to form the dielectric liner 251.

The dielectric layer 251' may be formed on an inner surface of the through-hole TH and an upper surface of the backside insulation layer 210. In this deposition operation, the dielectric layer 251' may be formed not only on the inner side wall of the through-hole TH, but also on the bottom surface THb of the through-hole TH. In this case, exposed contact area CA' of the buried conductive wiring 120 may be covered again by the dielectric layer 251' (see FIG. 11B). Then, an anisotropic etching operation may be applied to selectively remove a portion of the dielectric layer located on the upper surface of the backside insulation layer 210 and a portion of the dielectric layer located on the bottom surface THb of the through-hole. Therefore, the dielectric liner 251 may be formed by leaving a portion of the dielectric layer located on the inner side wall of the through-hole TH (see FIG. 11C).

Figure 11D:
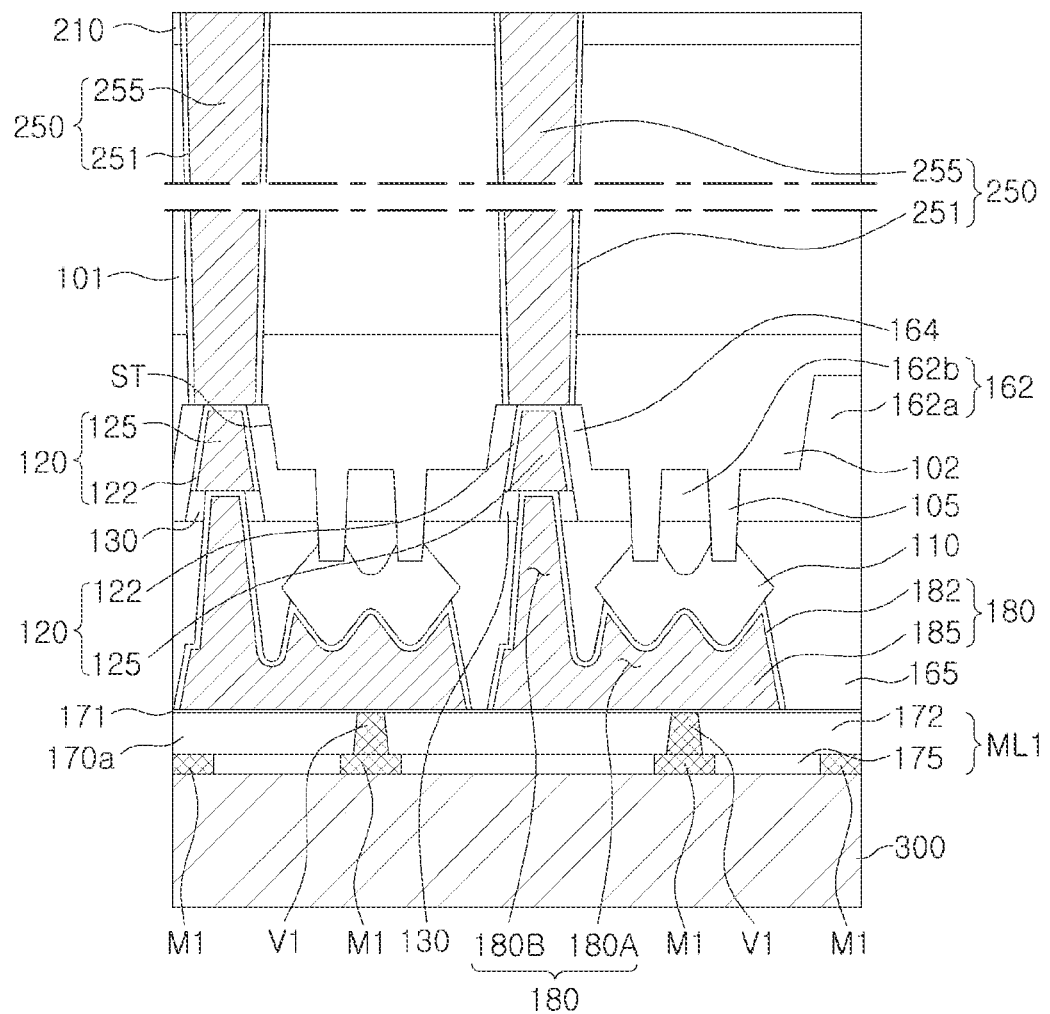
Figure 11E:
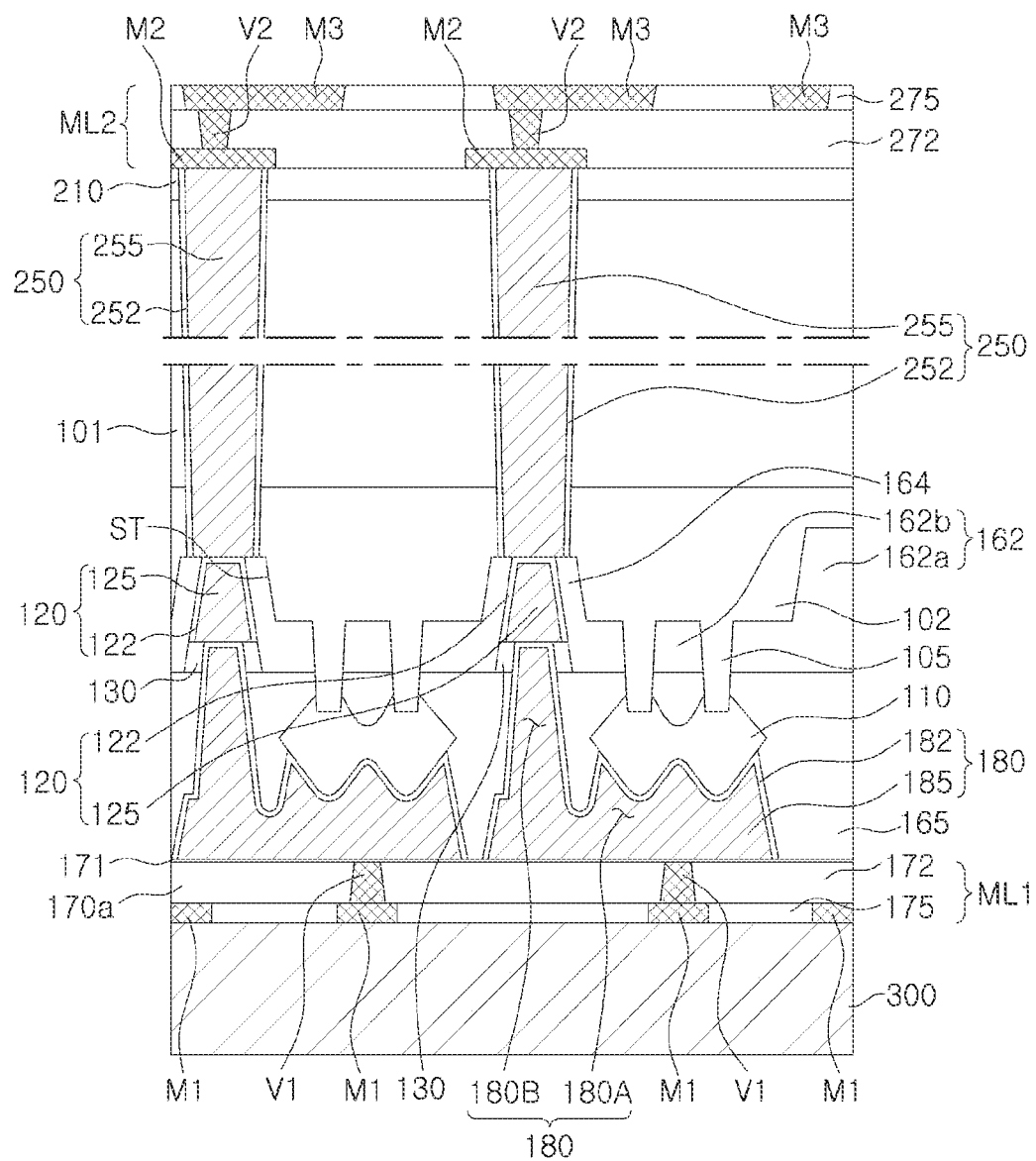

Referring to FIG. 11D, a conductive through structure 250 may be formed by depositing a conductive material 255. Referring to FIG. 11E, a second wiring portion ML2 connected to the conductive through structure 250 may be formed on the rear surface of the substrate 101.

The conductive material 255 may be deposited to fill the through-hole TH. The conductive material 255 may be connected to the contact area of the buried conductive wiring 120 exposed on the bottom surface THb of the through-hole TH. In this operation, when the size (e.g., the diameter) of the through-hole TH is greater than the width of the buried conductive wiring 120 or the through-hole TH is not aligned correctly, the conductive material 255 filling the through-hole TH may contact a portion of the filling insulation portion 164 located around the buried conductive wiring 120, to prevent unwanted shorts with the active region 102. In this deposition operation, a conductive material may also be deposited on the upper surface of the backside insulation layer 210. A planarization operation such as CMP may be applied to remove a portion of the conductive material 255 located on the upper surface of the backside insulation layer 210. Through the planarization operation, the upper surface of the backside insulation layer 210 and the upper surface of the conductive through structure 250 may have a substantially flat coplanar surface.

The second wiring portion ML2 may be formed on the backside insulation layer 210. The second wiring portion ML2 may include a plurality of low dielectric layers 272 and 275, a plurality of first and second metal wirings M2 and M3, and a plurality of metal vias V2. The first metal wiring M2 may be formed to be connected to the conductive through structure 250. The second metal wiring M3 and the metal via V2 may be formed using a dual damascene operation. The second wiring portion ML2 may provide a signal line and a power line for a plurality of elements (for example, transistors) implemented on the upper surface of the substrate 101, through the buried conductive wiring 120 and the conductive through structure 250.

A method of manufacturing the semiconductor device 100C illustrated in FIG. 6 may be divided into a process for forming a device portion and a first wiring portion (FIGS. 12A to 12E), and a process for forming a conductive through structure and a second wiring portion (FIGS. 13A to 13C), and will be explained separately. FIGS. 12A to 12E are cross-sectional views of processes illustrating a method of manufacturing the semiconductor device illustrated in FIG. 6 (a method of forming a device portion and a first wiring portion).

Figure 12A:
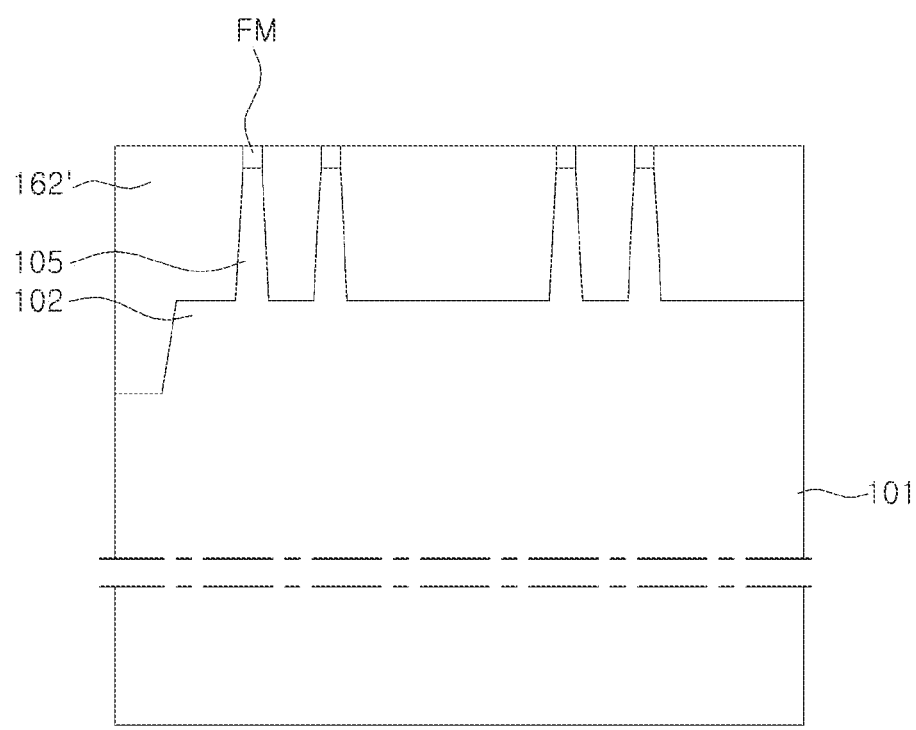
FIGS. 12A to 12E are cross-sectional views of processes illustrating a method of manufacturing the semiconductor device illustrated in FIG. 6 (a method of forming a device portion and a first wiring portion).

Referring to FIG. 12A, a first insulation layer 162' covering a plurality of active fins 105 may be formed.

A fin mask FM may be disposed on an upper surface of each of the plurality of active fins 105. The fin mask FM may be a mask that has been used in an operation for forming the plurality of active fins 105 prior to this operation. The first insulation layer 162' may be formed on a substrate 101 to cover the plurality of active fins 105. In this operation, after the first insulation layer 162' is formed to cover the fin mask FM, the first insulation layer 162' may be planarized using an operation such as CMP to expose the fin mask FM. In this operation, an active fin (105a in FIG. 10A) of a region in which a trench is to be formed in a previous operation may be removed in advance.

Figure 12B:
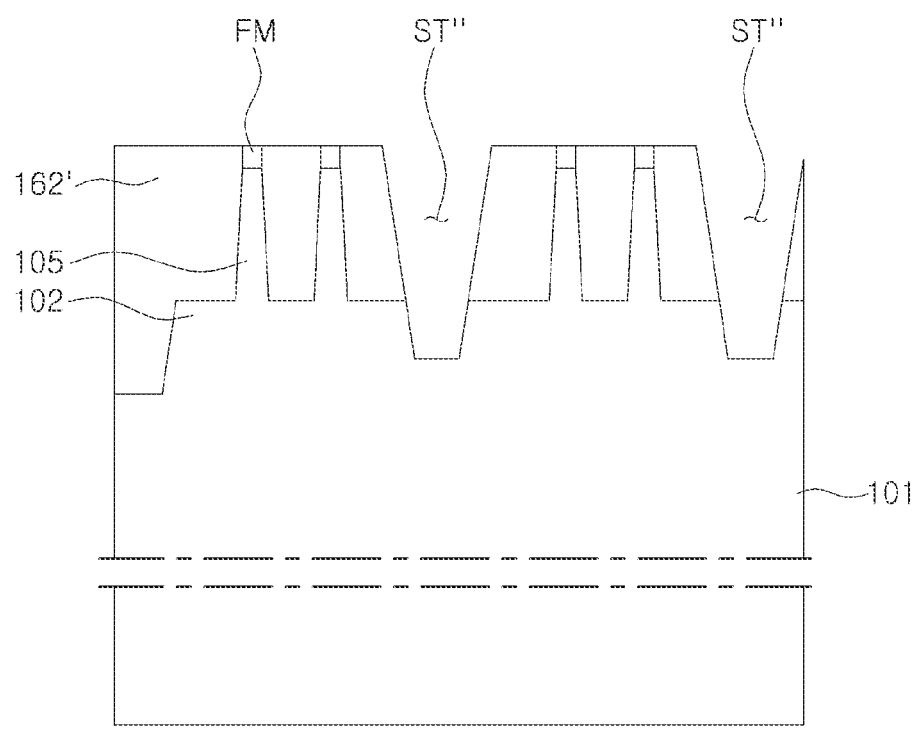

Referring to FIG. 12B, a trench ST" may be formed between ones of the plurality of active fins 105.

The trench ST" may be formed to extend in a first direction in which the plurality of active fins 105 extend. A formation region of the trench ST" may be located between the plurality of active fins 105. In a different manner to the previous embodiment, the trench ST" according to this embodiment may be formed to penetrate the first insulation layer 162' (particularly, a device isolation layer 162 in the final structure) and extend to a portion of a region of an active region 102. A bottom surface of the trench ST" may be provided by the active region 102.

Figure 12C:
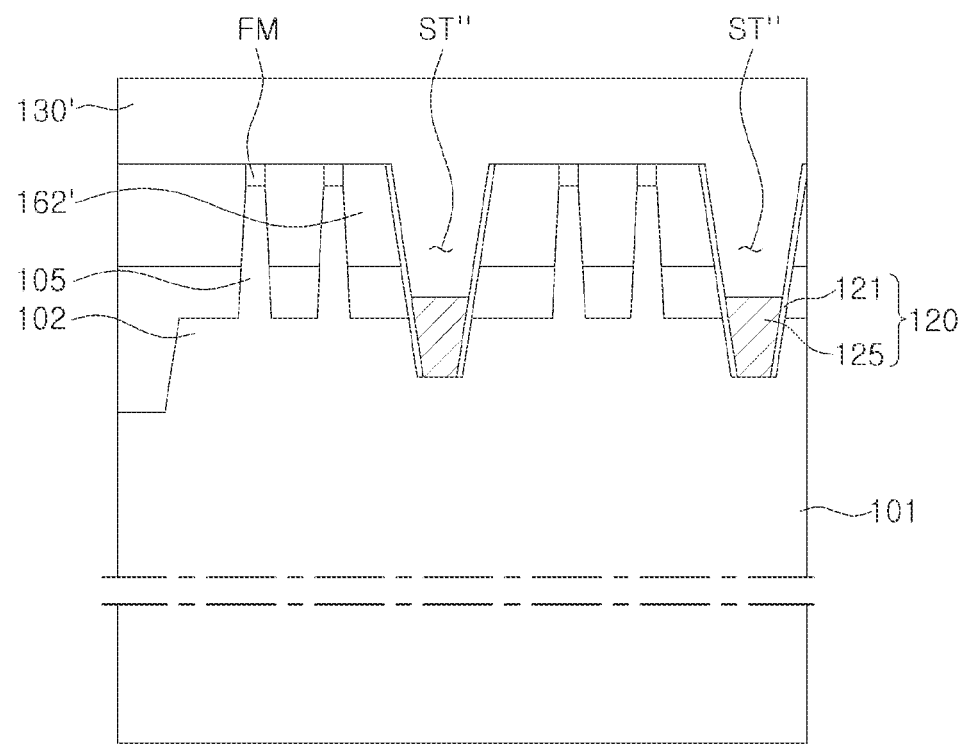

Referring to FIG. 12C, a buried conductive wiring 120 having a dielectric barrier 121 and a conductive material 125 may be formed in a trench ST", and the buried conductive wiring 120 may be embedded in the trench ST" by a second insulation layer 130'.

A dielectric film for the dielectric barrier 121 may be formed on an inner surface of the trench ST". In this operation, the dielectric film may be also formed on an upper surface of the first insulation layer 162'. A portion of the dielectric film located on the upper surface of the first insulation layer 162' and a portion of the dielectric film located on a bottom surface of the trench ST" may be selectively removed. Through this, the dielectric barrier 121 may be formed by leaving a portion of the dielectric film located on an inner side wall of the trench ST". The conductive material 125 may be etched back to adjust a height of the buried conductive wiring. Although the dielectric barrier is illustrated as being not further etched during the etch-back operation, it may be additionally etched in other embodiments (see FIGS. 7 and 8). The second insulation layer 130' may be used to embed the buried conductive wiring 120 in the trench ST".

Figure 12D:
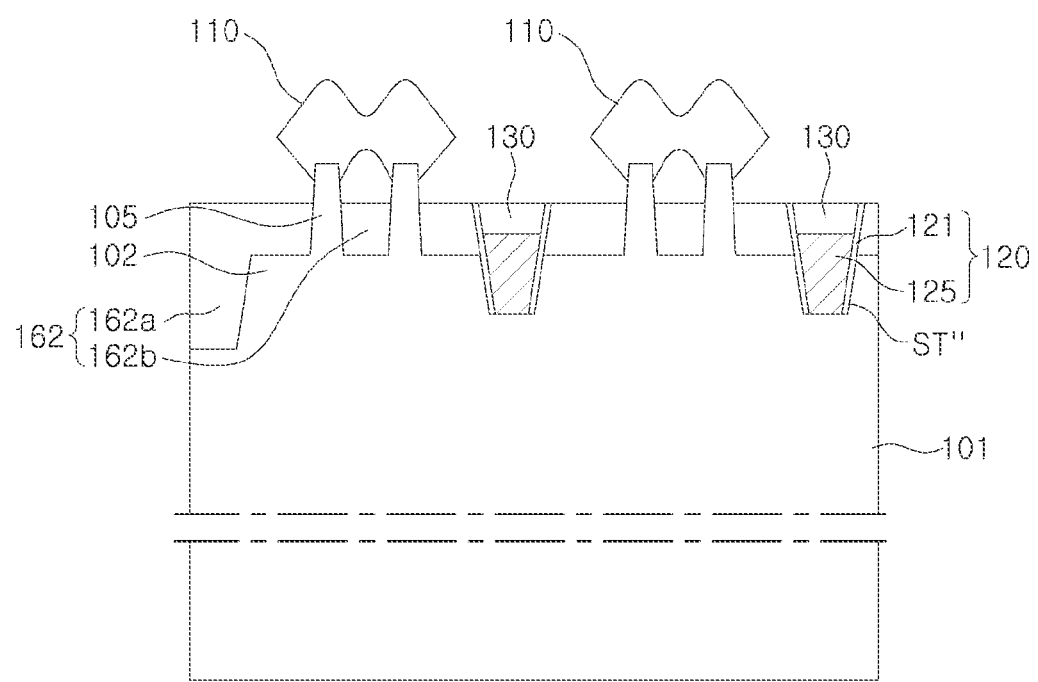

Referring to FIG. 12D, a portion of the second insulation layer 130' and a portion of the first insulation layer 162' may be removed to expose a portion of the active fin 105, and a source/drain region 110 may be formed on the exposed portion of the active fin 105.

In this operation, the portions of the second insulation layer 130' and the first insulation layer 162' may be removed using a planarization operation such as CMP. This operation may be performed until the fin mask FM is exposed. After removing the fin mask FM, an etch-back operation may be performed to remove the portions of the first and second insulation layers 162' and 130', to expose a portion of the plurality of active fins 105. The first insulation layer 162' obtained by this operation may be provided as a device isolation layer 162, and the second insulation layer 130' may be provided as an insulation capping layer 130. A recess may be formed in the exposed portion of the plurality of active fins 105, and a selective epitaxial growth operation may be performed in the recess to form the source/drain region 110.

Figure 12E:
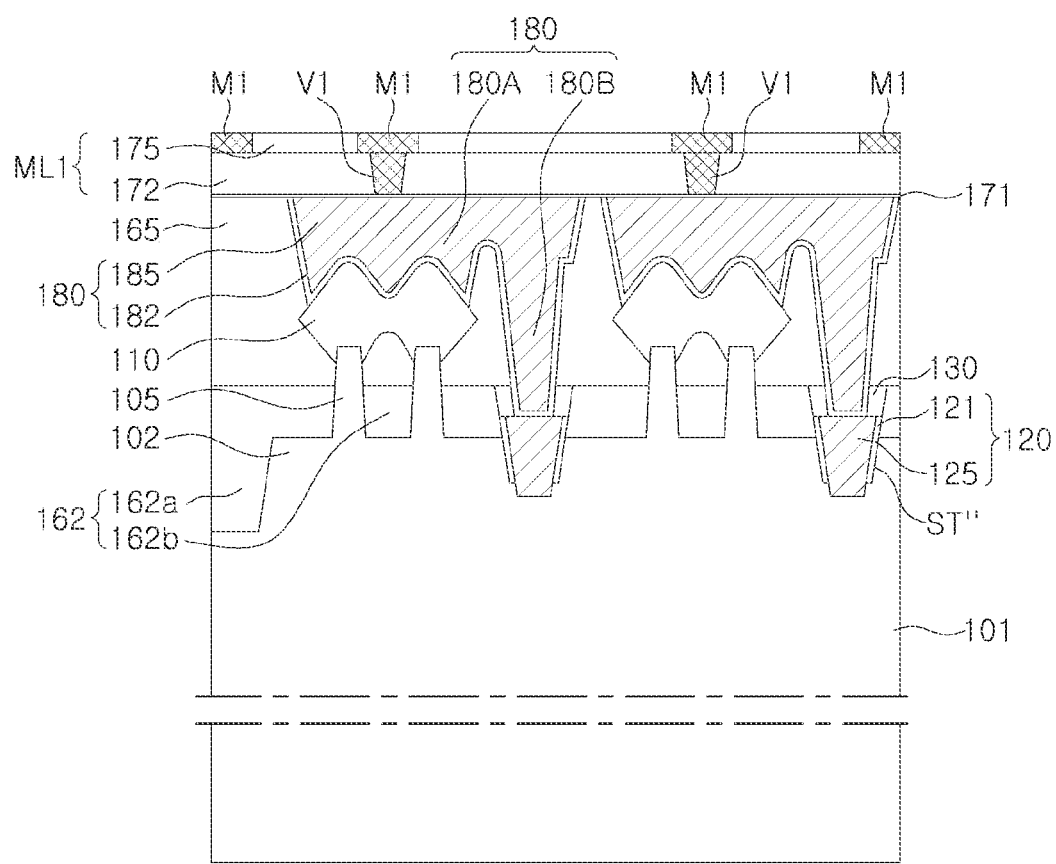

Referring to FIG. 12E, an interlayer insulation layer 165 may be formed, a contact structure 180 penetrating the interlayer insulation layer 165 may be formed, and a first wiring portion ML1 may be formed on the interlayer insulation layer 165.

An operation of forming the interlayer insulation layer 165 and the contact structure 180 can be understood with reference to FIG. 10F. An operation of forming the first wiring portion ML1 connected to the contact structure 180 on the interlayer insulation layer 165 can be understood with reference to FIG. 10G.

Figure 13C:
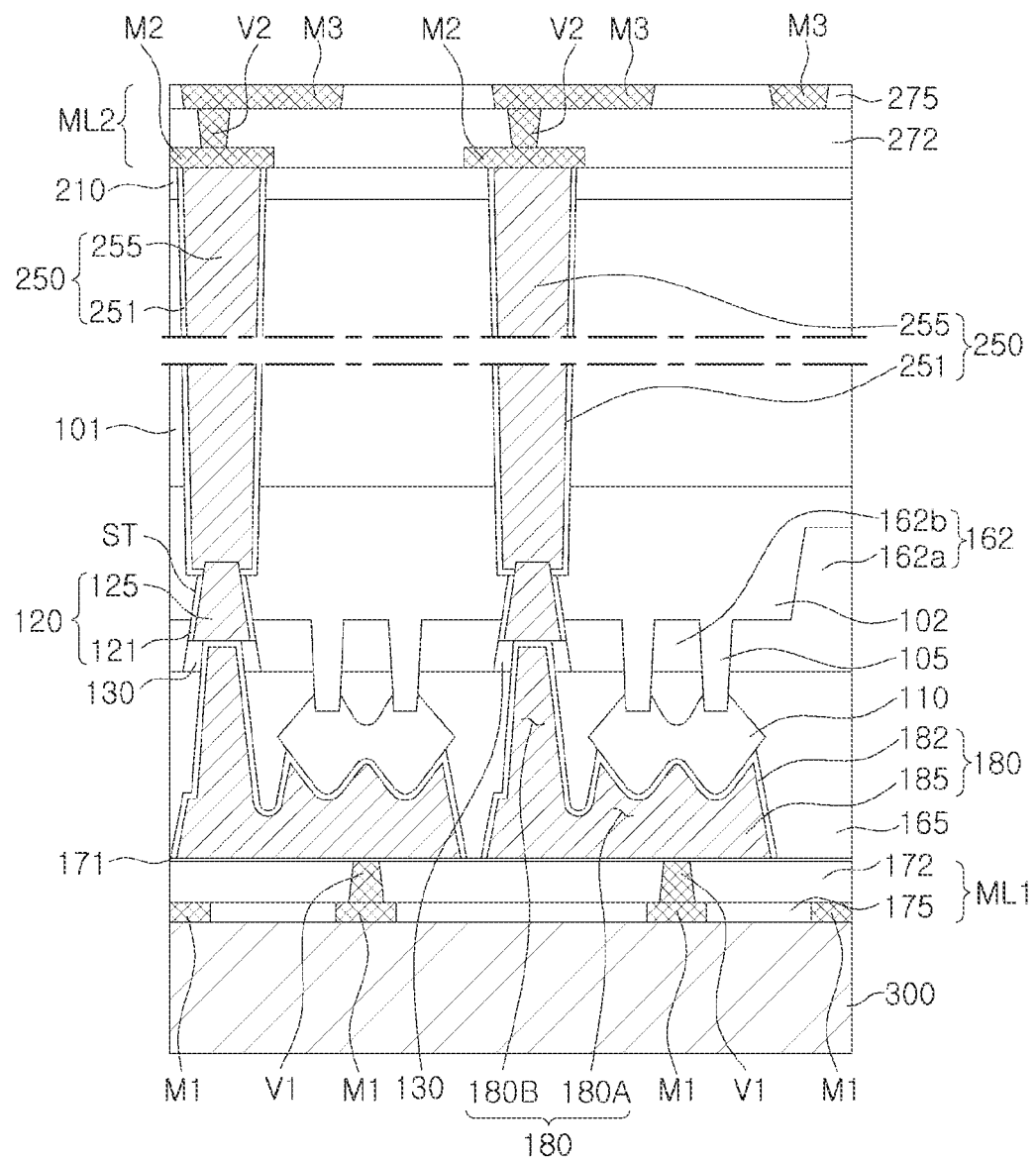

FIGS. 13A to 13C are cross-sectional views of processes illustrating a method of manufacturing the semiconductor device illustrated in FIG. 6 (a method of forming a conductive through structure and a second wiring portion).

Referring to FIG. 13A, the device manufactured in FIG. 12E may be attached to a support substrate 300, and a through-hole TH may be formed in the substrate 101.

The supporting substrate 300 may be attached to the first wiring portion ML1 of the device manufactured in FIG. 12E, to reverse a rear surface of the substrate 101 to face in an upward direction. A backside insulation layer 210 for passivation may be formed on the rear surface of the substrate 101. The through-hole TH may be formed to face the trench ST from or toward the rear surface of the substrate 101. A bottom surface of the through-hole TH may be formed to be higher than a contact area of the buried conductive wiring 120. For example, the through-hole TH may be formed such that a bottom surface and a side surface of the buried conductive wiring 120 are exposed.

Referring to FIG. 13B, a dielectric liner 251 may be formed on the inner surface of the through-hole TH using a selective deposition operation.

In this embodiment, the dielectric liner 251 may be formed on the inner side wall of the through-hole TH using an optional deposition operation. The selective deposition operation employed in this embodiment refers to an operation in which an insulating material may be only deposited on the surface of a semiconductor such as Si but not on the bottom surface of the buried conductive wiring 120. For example, the selective deposition operation may be performed by an atomic layer deposition (ALD) operation. The dielectric liner 251 may not be formed in the conductive material 125 of the buried conductive wiring 120 at the bottom surface THb of the through-hole TH, but may be formed only on the exposed surface of the active region 102. In a different manner to the operations illustrated in FIGS. 11B and 11C, the dielectric liner 251 employed in this embodiment may be formed by selective deposition on a surface of the semiconductor (e.g., a surface of the substrate 101 and a surface of the active region 102) exposed on the inner surface of the through-hole TH, for example, the inner side wall of the through-hole TH and the bottom surface THb, excluding the buried conductive wiring 120. As described above, in this embodiment, a contact area CA of the buried conductive wiring 120 may be exposed after the formation of the dielectric liner without any additional operation. The dielectric liner 251 may have a uniform thickness.

Referring to FIG. 13C, a conductive through structure 250 may be formed in the through-hole TH, and a second wiring portion ML2 connected to the conductive through structure 250 may be formed on the rear surface of the substrate 101.

A conductive material 255 may be deposited to fill the through-hole TH. The conductive material 255 may be connected to the contact area of the buried conductive wiring 120 exposed on the bottom surface THb of the through-hole TH. In this deposition operation, the conductive material 255 may be deposited on an upper surface of the backside insulation layer 210. A planarization operation such as CMP may be applied to remove a portion of the conductive material 255 located on the upper surface of the backside insulation layer 210. Through the planarization operation, the upper surface of the backside insulation layer 210 and the upper surface of the conductive through structure 250 may have a substantially flat coplanar surface. The dielectric liner 251 may be also formed on the upper surface of the backside insulation layer 210. After the conductive material 255 of the conductive through structure 250 is filled, portions of the dielectric liner 251 and the conductive material 255 located on the upper surface of the backside insulation layer 210 may be removed using the planarization operation.

The second wiring portion ML2 may be formed on the backside insulation layer 210. The second wiring portion ML2 may include a plurality of low dielectric layers 272 and 275, a plurality of first and second metal wirings M2 and M3, and a plurality of metal vias V2. The first metal wiring M2 may be formed to be electrically connected to the conductive through structure 250. The second metal wiring M3 and the metal via V2 may be formed using a dual damascene operation. The second wiring portion ML2 may provide a signal line and a power line for a plurality of elements (for example, transistors) implemented on the upper surface of the substrate 101, through the buried conductive wiring 120 and the conductive through structure 250.

Accordingly, in accordance with some embodiments of the present disclosure, when a conductive through structure such as a through silicon via may be formed on a substrate and connected to a buried conductive wiring, a short circuit with other adjacent components (for example, an active region such as Si) may be prevented without decreasing the size of the conductive through structure.

The various and advantageous advantages and effects of the present disclosure is not limited to the above description, but may be more readily understood in the course of describing specific embodiments of the present inventive concepts.

While example embodiments have been illustrated and described above, it will be apparent to those skilled in the art that modifications and variations could be made without departing from the scope of the present disclosure as defined by the appended claims.

What is claimed is:

1. A method of manufacturing a semiconductor architecture, the method comprising:
    providing a substrate having a first surface and a second surface opposite to each other, the substrate comprising an active region on the first surface and a plurality of active fins arranged on the active region;
    forming a first trench in the active region adjacent to the plurality of active fins;
    forming a first insulation layer covering the plurality of active fins on the substrate;
    forming a second trench in a portion of the first insulation layer disposed in the first trench, the second trench exposing a bottom surface of the first trench;
    forming a buried conductive structure in the second trench, the buried conductive structure having an upper surface being lower than an upper surface of the first insulation layer;
    forming a second insulation layer on the first insulation layer, the second insulation layer having a portion filling in the second trench;
    recessing the first and second insulation layers to expose portions of the plurality of active fins;
    forming a source or drain region on at least one of the exposed portions of the plurality of active fins;
    forming a conductive structure electrically connecting the source or drain region to the buried conductive structure; and
    forming a conductive through-structure in the substrate, the conductive through-structure extending from the second surface of the substrate to the buried conductive structure.

2. The method according to claim 1, wherein the recessed first insulation layers are a device isolation layer, the portions of the plurality of active fins protrude from an upper surface of the device isolation layer, and
    the recessed second insulation layers are a filling insulation portion on the buried conductive structure and in the second trench.

3. The method according to claim 2, wherein the device isolation layer has an upper surface substantially coplanar with an upper surface of the filling insulation portion.

4. The method according to claim 2, wherein the upper surface of the buried conductive structure is higher than an upper surface of the active region and lower than upper ends of the plurality of active fins.

5. The method according to claim 1, wherein the second trench exposes a portion of the active region.

6. The method according to claim 1, wherein the conductive through-structure penetrates the substrate and has an upper end contacting a portion of the first insulating layer in the first trench.

7. The method according to claim 6, wherein the upper end of the conductive through-structure is higher than a bottom surface of the buried conductive structure.

8. The method according to claim 1, wherein the first trench has a first width greater than a second width of the second trench.

9. The method according to claim 1, wherein the buried conductive structure is surrounded by the portion the first insulation layer in the first trench.

10. The method according to claim 1, wherein the buried conductive structure comprises a conductive material, and a conductive barrier on a side surface and a lower surface of the conductive material.

11. The method according to claim 10, wherein the buried conductive structure further comprises a dielectric barrier between the conductive barrier and the portion of the first insulation layer.

12. The method according to claim 1, wherein the conductive through-structure comprises a conductive material, and comprises a dielectric liner between the conductive material and the substrate.

13. The method according to claim 1, wherein the conductive structure comprises a contact structure contacting the source or drain region, and the contact structure has an extension portion extending to the buried conductive structure.

14. The method according to claim 13, further comprising forming an interlayer insulation layer on the recessed first and second insulation layer to cover the source or drain region; and
forming a first wiring portion on the interlayer insulation layer, the first wiring portion electrically connected to the contact structure.

15. The method according to claim 1, further comprising forming a second wiring portion on the second surface of the substrate, the second wiring portion electrically connected to the conductive through-structure.

16. A method of manufacturing a semiconductor architecture, the method comprising:
providing a substrate having a first surface and a second surface opposite to each other, the substrate comprising an active region on the first surface and a plurality of active fins arranged on the active region;
forming a first insulation layer covering the plurality of active fins on the substrate;
forming a trench in the first insulation layer, a bottom surface of the trench provided by the active region;
forming a buried conductive structure in the trench, the buried conductive structure having an upper surface being lower than an upper surface of the first insulation layer;
forming a second insulation layer on the first insulation layer, the second insulation layer having a portion filling in the trench;
recessing the first and second insulation layers to expose portions of the plurality of active fins;
forming a source or drain region on at least one of the exposed portions of the plurality of active fins;
forming a conductive structure electrically connecting the source or drain region to the buried conductive structure; and
forming a conductive through-structure in the substrate, the conductive through-structure extending from the second surface of the substrate to the buried conductive structure.

17. The method according to claim 16, wherein the trench extends into the active region, and the buried conductive structure has a bottom surface being lower than the upper surface of the active region.

18. The method according to claim 17, wherein the buried conductive structure comprises a conductive material, and a dielectric barrier on a side surface of the conductive material, and the dielectric barrier extends to a lower surface of the conductive material excluding a contact area with the conductive through-structure.

19. The method according to claim 16, wherein the upper surface of the buried conductive structure is higher than an upper surface of the active region and lower than upper ends of the plurality of active fins.

20. A method of manufacturing a semiconductor architecture, the method comprising:
providing a substrate having a first surface and a second surface opposite to each other, the substrate comprising an active region on the first surface and a plurality of active fins arranged on the active region;
forming a first trench in the active region adjacent to the plurality of active fins;
forming a first insulation layer covering the plurality of active fins on the substrate;
forming a second trench in a portion of the first insulation layer disposed in the first trench, the second trench exposing a portion of the active region, and having a width being smaller than a width of the first trench;
forming a buried conductive structure in the second trench, the buried conductive structure having an upper surface being higher than an upper surface of the active region and lower than upper ends of the plurality of active fins;
forming a second insulation layer on the first insulation layer, the second insulation layer having a portion filling in the second trench; and
recessing the first and second insulation layers to expose portions of the plurality of active fins,
wherein the recessed first insulation layers are a device isolation layer, the portions of the plurality of active fins protrude from an upper surface of the device isolation layer, and the recessed second insulation layers is a filling insulation portion on the buried conductive structure and in the second trench,
wherein the device isolation layer has an upper surface being substantially coplanar with an upper surface of the filling insulation portion.

* * * * *